(12) United States Patent
Okada et al.

(10) Patent No.: US 7,781,495 B2
(45) Date of Patent: Aug. 24, 2010

(54) COMPOSITION CURABLE BY RADICAL PHOTO CURING AND CATIONIC PHOTO CURING IN COMBINATION

(75) Inventors: Kenji Okada, Kobe (JP); Yoshiki Nakagawa, Settsu (JP)

(73) Assignee: Kaneka Corporation, Osaka (JP)

( * ) Notice: Subject to any disclaimer, the term of this patent is extended or adjusted under 35 U.S.C. 154(b) by 1003 days.

(21) Appl. No.: 10/594,228

(22) PCT Filed: Mar. 25, 2005

(86) PCT No.: PCT/JP2005/005510

§ 371 (c)(1),
(2), (4) Date: Sep. 25, 2006

(87) PCT Pub. No.: WO2005/092981

PCT Pub. Date: Jun. 10, 2005

(65) Prior Publication Data

US 2007/0208098 A1    Sep. 6, 2007

(30) Foreign Application Priority Data

Mar. 26, 2004  (JP) .............................. 2004-092556

(51) Int. Cl.
*C08F 2/50* (2006.01)
*C08J 3/28* (2006.01)

(52) U.S. Cl. .................. 522/178; 522/168; 522/170; 522/172; 522/182; 522/150; 522/151; 522/152; 522/153; 522/173; 522/174

(58) Field of Classification Search ................. 522/168, 522/170, 178, 182, 150, 153, 90, 173, 174, 522/181, 152

See application file for complete search history.

(56) References Cited

U.S. PATENT DOCUMENTS 6,949,591 B1    9/2005    Allard et al.

FOREIGN PATENT DOCUMENTS

| DE | 199 20 799 A1 | 11/2000 |
| JP | 1-197520 A | 8/1989 |
| JP | 8-277385 A | 10/1996 |
| JP | 9-309944 A | 12/1997 |
| JP | 2001-55551 A | 2/2001 |
| JP | 2001-83531 A | 3/2001 |
| JP | 2003-213204 A | 7/2003 |
| WO | WO 00/46315 A1 | 8/2000 |

*Primary Examiner*—Sanza L McClendon
(74) *Attorney, Agent, or Firm*—Sughrue Mion, PLLC

(57) ABSTRACT

A curable composition having a low viscosity and providing a satisfactory rubber cured article is provided. A composition curable by radical photo curing and cationic photo curing in combination, comprising the under-mentioned components (A), (B), (C) and (D) as essential components:

- (A) a vinyl polymer having two or more acryloyl group or the like per molecule, the acryloyl groups or the like being present at one or more molecular ends;
- (B) an epoxy compound and/or an oxetane compound;
- (C) a radical photopolymerization initiator; and
- (D) a cationic photopolymerization initiator.

23 Claims, No Drawings

COMPOSITION CURABLE BY RADICAL PHOTO CURING AND CATIONIC PHOTO CURING IN COMBINATION

TECHNICAL FIELD

The present invention relates to a composition curable by radical photo curing and cationic photo curing in combination. More specifically, the present invention relates to a composition curable by radical photo curing and cationic photo curing in combination comprising a vinyl polymer having (meth)acryloyl group at its molecular ends, and an epoxy compound or an oxetane compound as essential components.

BACKGROUND ART

Acrylic rubbers are used as functional parts, security parts, and the like centralized in the surrounding of the engine of automobiles due to their characteristics such as heat resistance and oil resistance.

However, curing of the acrylic rubber involves problems that processability is poor because the rubber adheres to a roll in kneading with additives such as a filling agent and a vulcanizing agent, is hardly smoothed on sheeting, or is non-flowable on molding and that curability is poor because vulcanization speed is slow or post-cure for a long time is required. Further, there are many problems such as poor reliability and the necessity of high-precision processing of flange face when the acrylic rubber is used as a seal.

Acrylic ribbers in which processability and curability were improved are reported (Patent Document 1), but they cannot be cured by photo curing which enables rapid curing, resulting in failure to improve productivity.

Design of a polymer having large molecular weight between crosslinking points is required for obtaining satisfactory rubber elasticity and elongation of a cured article. The present inventors have hitherto reported a polymer wherein its main chain is an acrylic polymer obtained by living radical polymerization and which has a (meth)acryloyl group at its end (Patent Documents 2 and 3).

However, there is apprehension that a polymer having large molecular weight is high in viscosity and workability is inferior. Further, when a reinforcing filler such as Aerosil is added to an acrylic polymer not having adequate strength, there is a problem that viscosity is further increased.

Technology with respect to the combination use of radical photopolymerization and cationic photopolymerization has been reported (Patent Documents 4 and 5), but there have not been reported a polymer having an acrylic polymer as a main chain and a material having heat resistance, weather resistance and oil resistance in good balance.

Patent Document 1: JP-A-2000-154370
Patent Document 2: JP-A-2000-72816
Patent Document 3: JP-A-2000-95826
Patent Document 4: JP-A-5-117592
Patent Document 5: JP-A-8-143755

DISCLOSURE OF INVENTION

Problem to be Solved by the Invention

It is an object of the present invention to provide a curable composition having low viscosity and providing a cured article having satisfactory strength characteristics with making the most use of the characteristics of a vinyl polymer, for example, an acrylic polymer, such as heat resistance, weather resistance and oil resistance.

Means for Solving the Problem

The present invention relates to a novel composition curable by radical photo curing and cationic photo curing in combination, comprising the constitution below:

(1) A composition curable by radical photo curing and cationic photo curing in combination, comprising the undermentioned components (A), (B), (C) and (D) as essential components:

(A) a vinyl polymer having two or more groups represented by general formula (1):

$$—OC(O)C(R^a)=CH_2 \quad (1)$$

wherein $R^a$ represents a hydrogen atom or an organic group having 1 to 20 carbon atoms, per molecule, the group represented by general formula (1) being present at one or more molecular ends;

(B) an epoxy compound and/or an oxetane compound;
(C) a radical photopolymerization initiator; and
(D) a cationic photopolymerization initiator.

(2) The curable composition of (1) above, wherein the vinyl monomer constituting the main chain of component (A) comprises a (meth)acrylic monomer as a main component.

(3) The curable composition of any one of (1) and (2) above, wherein the vinyl monomer constituting the main chain of component (A) comprises an acrylic acid ester monomer as a main component.

(4) The curable composition of any one of (1) to (3) above, wherein the vinyl monomer constituting the main chain of component (A) contains at least 2 monomers selected from the group consisting of butyl acrylate, ethyl acrylate and 2-methoxyethyl acrylate.

(5) The curable composition of any one of (1) to (4) above, wherein $R^a$ is a hydrogen atom or a hydrocarbon group having 1 to 20 carbon atoms.

(6) The curable composition of (5) above, wherein $R^a$ is a hydrogen atom or a methyl group.

(7) The curable composition of any one of (1) to (6) above, wherein component (A) is produced by reacting a compound indicated by general formula (2):

$$M^+{}^-OC(O)C(R^a)=CH_2 \quad (2)$$

wherein $R^a$ represents a hydrogen atom or an organic group having 1 to 20 carbon atoms and $M^+$ represents an alkali metal ion or a quaternary ammonium ion, with a vinyl polymer having halogen groups at the molecular ends.

(8) The curable composition of (7) above, wherein the vinyl polymer having halogen groups at the molecular ends has a group indicated by general formula (3):

$$—CR^1R^2X \quad (3)$$

wherein $R^1$ and $R^2$ represent a group bonded to the ethylenically unsaturated group of a vinyl monomer, and X represents a chlorine atom, a bromine atom or an iodine atom.

(9) The curable composition of any one of (1) to (6) above, wherein component (A) is produced by reacting a compound indicated by general formula (4):

$$X^1C(O)C(R^a)=CH_2 \quad (4)$$

wherein $R^a$ represents a hydrogen atom or an organic group having 1 to 20 carbon atoms, and $X^1$ represents a chlorine atom, a bromine atom or a hydroxyl group, with a vinyl polymer having hydroxyl groups at the molecular ends.

(10) The curable composition of any one of (1) to (6) above, wherein component (A) is produced by:

(1) reacting a diisocyanate compound with a vinyl polymer having hydroxyl groups at the molecular ends, and (2) reacting a compound indicated by general formula (5):

$$HO—R'—OC(O)C(R^a)=CH_2 \qquad (5)$$

wherein $R^a$ represents a hydrogen atom or an organic group having 1 to 20 carbon atoms and R' represents a divalent organic group having 2 to 20 carbon atoms, with the residual isocyanate group.

(11) The curable composition of any one of (1) to (10), wherein the main chain of component (A) is produced by a living radical polymerization of a vinyl monomer.

(12) The curable composition of (11) above, wherein the living radical polymerization is atom transfer radical polymerization.

(13) The curable composition of (12) above, wherein a transition metal complex being the catalyst of the atom transfer radical polymerization is selected from complexes of copper, nickel, ruthenium and iron.

(14) The curable composition of (13) above, wherein the transition metal complex is a complex of copper.

(15) The curable composition of any one of (1) to (10), wherein the main chain of component (A) is produced by the polymerization of a vinyl monomer using a chain transfer agent.

(16) The curable composition of any one of (1) to (15) above, wherein component (A) has a number average molecular weight of 3,000 or more.

(17) The curable composition of any one of (1) to (16) above, wherein the vinyl polymer of component (A) has a ratio of weight average molecular weight to number average molecular weight of less than 1.8 determined by gel permeation chromatography.

(18) The curable composition of any one of (1) to (17) above, which further contains a monomer and/or an oligomer having a radical polymerizable group.

(19) The composition of any one of (1) to (18) above, which further contains a monomer and/or an oligomer having an anionic polymerizable group.

(20) The curable composition of any one of (18) or (19) above, which contains a monomer and/or an oligomer having a (meth)acryloyl group.

(21) The curable composition of (20) above, which contains a monomer and/or an oligomer having a (meth)acryloyl group and having a number average molecular weight of 5,000 or less.

(22) The curable composition of any one of (1) to (21) above, wherein the epoxy compound and/or oxetane compound of component (B) has no aromatic ring.

(23) The curable composition of any one of (1) to (22) above, which further contains (E) a compound having both an epoxy group and a (meth)acryloyl group in its molecule.

(24) The curable composition of (23) above, wherein component (E) is glycidyl methacrylate.

Effect of the Invention

The present invention can provide a composition curable by radical photo curing and cationic photo curing in combination which has low viscosity and provides a cured article having satisfactory strength characteristics together with having characteristics of an acrylic polymer, such as heat resistance, weather resistance and oil resistance.

BEST MODE FOR CARRYING OUT THE INVENTION

The composition curable by radical photo curing and cationic photo curing in combination in accordance with the present invention is described below.

<Component (A)>

Component (A) is a vinyl polymer having two or more groups represented by general formula (1):

$$—OC(O)C(R^a)=CH_2 \qquad (1)$$

wherein $R^a$ represents a hydrogen atom or an organic group having 1 to 20 carbon atoms, per molecule, the group represented by general formula (1) being present at one or more molecular ends.

The number of the group represented by general formula (1) ((meth)acryloyl group) in component (A) is two or more per molecule from the viewpoint of crosslinking, preferably 2 to 3, more preferably 2. When component (A) is produced, side reaction occurs actually; therefore the average value of the number of groups represented by general formula (1) in a mixture of vinyl polymers produced is occasionally less than 2. However, in the present invention, when the average value of the number of groups represented by general formula (1) in the mixture is 1.1 or more with respect to the mixture of vinyl polymers practically produced, the mixture can be called as component (A).

From the viewpoint of crosslinking, the average value of the number of the (meth)acryloyl group is preferably 1.5 or more per molecule.

At least one of the (meth)acryloyl groups exists at the molecular end. The position of another (meth)acryloyl group is not specifically limited but exists preferably at another molecular end of the vinyl polymer from the viewpoint of obtaining rubber elasticity by enlarging molecular weight between crosslinking points.

The $R^a$ in the (meth)acryloyl group represents a hydrogen atom or an organic group having 1 to 20 carbon atoms and is preferably a hydrogen atom or a hydrocarbon group having 1 to 20 carbon atoms.

Examples of the organic group having 1 to 20 carbon atoms include an alkyl group having 1 to 20 carbon atoms, an aryl group having 6 to 20 carbon atoms, an aralkyl group having 7 to 20 carbon atoms, and a nitrile group, and these may have a substituent such as a hydroxyl group.

Examples of the alkyl group having 1 to 20 carbon atoms include a methyl group, an ethyl group, a propyl group, a butyl group, a pentyl group, a hexyl group, an octyl group, and a decyl group; examples of the aryl group having 6 to 20 carbon atoms include a phenyl group, and a naphthyl group; and examples of the aralkyl group having 7 to 20 carbon atoms include a benzyl group, and a phenylethyl group.

Specific examples of $R^a$ include, for example, —H, —$CH_3$, —$CH_2CH_3$, —$(CH_2)_nCH_3$ (n represents an integer of 2 to 19), —$C_6H_5$, —$CH_2OH$, and —CN and are preferably —H and —$CH_3$.

The vinyl monomer composing the main chain of component (A) is not specifically limited and various monomers can be used. Examples thereof include (meth)acrylic monomers such as (meth)acrylic acid, methyl(meth)acrylate, ethyl (meth)acrylate, n-propyl(meth)acrylate, isopropyl(meth) acrylate, n-butyl(meth)acrylate, isobutyl(meth)acrylate, tert-butyl(meth)acrylate, n-pentyl(meth)acrylate, n-hexyl(meth)

acrylate, cyclohexyl(meth)acrylate, n-heptyl(meth)acrylate, n-octyl(meth)acrylate, 2-ethylhexyl(meth)acrylate, nonyl (meth)acrylate, decyl(meth)acrylate, dodecyl(meth)acrylate, phenyl(meth)acrylate, tolyl(meth)acrylate, benzyl(meth) acrylate, 2-methoxyethyl(meth)acrylate, 3-methoxybutyl (meth)acrylate, 2-hydroxyethyl(meth)acrylate, 2-hydroxypropyl(meth)acrylate, stearyl(meth)acrylate, glycidyl (meth)acrylate, 2-aminoethyl(meth)acrylate, γ-(methacryloyloxy)propyltrimethoxysilane, an ethylene oxide adduct of (meth)acrylic acid, trifluoromethylmethyl (meth)acrylate, 2-trifluoromethylethyl(meth)acrylate, 2-perfluoroethylethyl(meth)acrylate, 2-perfluoroethyl-2-perfluorobutylethyl(meth)acrylate, 2-perfluoroethyl(meth)acrylate, perfluoromethyl(meth)acrylate, di-perfluoromethylmethyl (meth)acrylate, 2-perfluoromethyl-2-perfluoroethylethyl (meth)acrylate, 2-perfluorohexylethyl(meth)acrylate, 2-perfluorodecylethyl(meth)acrylate and 2-perfluorohexadecylethyl(meth)acrylate; aromatic vinyl monomers such as styrene, vinyl toluene, α-methylstyrene, chlorostyrene, and styrenesulfonic acid and its salt; fluorine-containing vinyl monomers such as perfluoroethylene, perfluoropropylene and vinylidene fluoride; silicon-containing vinyl monomers such as vinyl trimethoxysilane and vinyl triethoxysilane; maleic anhydride, maleic acid, mono alkyl esters and dialkyl esters of maleic acid; fumaric acid, mono alkyl esters and dialkyl esters of fumaric acid; maleimide monomers such as maleimide, methylmaleimide, ethylmaleimide, propylmaleimide, butylmaleimide, hexylmaleimide, octylmaleimide, dodecylmaleimide, stearylmaleimide, phenylmaleimide and cyclohexylmaleimide; vinyl monomers containing a nitrile group such as acrylonitrile and methacrylonitrile; vinyl monomers containing an amide group such as acrylamide and methacrylamide; vinyl esters such as vinyl acetate, vinyl propionate, vinyl pivalate, vinyl benzoate and vinyl cinnamate; alkenes such as ethylene and propylene; conjugated dienes such as butadiene and isoprene; vinyl chloride, vinylidene chloride, allyl chloride, allyl alcohol and the like. These may be used alone and a plurality of them may be also used in combination.

Among these, it is preferable to use aromatic vinyl monomers or (meth)acrylic monomers as a main component from the viewpoint of the physical properties of the resulting product. It is more preferable to use acrylic acid ester monomers or methacrylic acid ester monomers as a main component. Butyl acrylate, ethyl acrylate and 2-methoxyethyl acrylate are further preferable. The vinyl monomer composing the main chain particularly preferably contains at least 2 monomers selected from the group consisting of butyl acrylate, ethyl acrylate and 2-methoxyethyl acrylate from the viewpoint of oil resistance and the like. Herein, the term "(meth)acrylic acid" means acrylic acid and/or methacrylic acid.

In the present invention, these preferable monomers may be copolymerized with the above-mentioned other monomers. Herein, these preferable monomers are preferably contained by at least 40% by weight ratio, more preferably by at least 60% by weight ratio, as the "main component". Further, when the vinyl monomer composing the main chain contains at least 2 selected from the group consisting of butyl acrylate, ethyl acrylate and 2-methoxyethyl acrylate, the total amount of these monomers are preferably contained by at least 40%, more preferably by at least 60%.

The molecular weight distribution (the ratio of weight average molecular weight (Mw) to number average molecular weight (Mn) measured by gel permeation chromatography (GPC)) of component (A) is not specifically limited, but preferably less than 1.8, more preferably not more than 1.7, further preferably not more than 1.6, particularly preferably not more than 1.5, specifically preferably not more than 1.4 and the most preferably not more than 1.3.

For the measurement of molecular weight by GPC in the present invention, a polystyrene gel column is used usually using chloroform or tetrahydrofuran as mobile phase and the value of molecular weight is determined as a value converted to polystyrene.

The lower limit of the number average molecular weight of component (A) is preferably 500 and more preferably 3,000, and the upper limit is preferably 100,000 and more preferably 40,000. When the molecular weight is less than 500, the natural property of the vinyl polymer tends to be hardly expressed and when it exceeds 100,000, handling tends to be difficult.

<Manufacturing Process of Component (A)>

The manufacturing process of component (A) is not specifically limited.

The vinyl polymer is generally produced by anion polymerization or radical polymerization, but the radical polymerization is preferable from the viewpoint of the versatility of the monomer or the easiness of control. Among the radical polymerizations, living radical polymerization and radical polymerization using a chain transfer agent are more preferable and the former is preferable in particular.

The radical polymerization process used for the production of component (A) can be classified as "general radical polymerization process" in which a monomer having a specific functional group and a vinyl monomer are merely copolymerized using an azo compound, a peroxide or the like as a polymerization initiator and "controlled radical polymerization process" in which a specific functional group can be introduced into a controlled position such as the end of a polymer.

The "general radical polymerization process" is a simple process but since a monomer having a specific functional group is only probabilistically introduced into the polymer, a large quantity of the monomer is required when a polymer having high functionalized rate is desired to be obtained. To the contrary, there is a problem that small amount of the monomer used increases the proportion of a polymer in which a specific functional group is not introduced. Further, since it is free radical polymerization, there is a problem that only a polymer having a wide molecular weight distribution and a high viscosity is obtained.

Further, the "controlled radical polymerization" can be classified as "chain transfer agent process" in which a vinyl polymer having functional groups at the ends is obtained by carrying out polymerization using a chain transfer agent having a specific functional group, and "living radical polymerization process" in which polymerization propagation terminal is grown without provoking termination reaction and thereby a polymer with nearly designed molecular weight is obtained.

The "chain transfer agent process" can provide a polymer having high functionalized rate but a remarkably large quantity of chain transfer agent having a specific functional group is necessary against an initiator, resulting in an economical problem including treatment. Further, like the above-mentioned "general radical polymerization process", since it is free radical polymerization, there is a problem that only a polymer having a wide molecular weight distribution and a high viscosity is obtained.

Differing from these polymerization processes, the "living radical polymerization process" is characterized as follows: it is high in polymerization speed; termination reaction occurs hardly nevertheless it is radical polymerization in which termination reactions due to coupling of radicals easily occur and control is difficult; a polymer with narrow molecular weight distribution (Mw/Mn is about 1.1 to 1.5) is obtained; and the molecular weight can be freely controlled according to the charge ratio of a monomer to an initiator.

Accordingly, the "living radical polymerization process" can provide a polymer with narrow molecular weight distribution and low viscosity and additionally, since a monomer having a specific functional group can be introduced at nearly arbitrary position, it is more preferable as the manufacturing process of the vinyl polymer having the specific functional group.

The living polymerization means polymerization in which terminal keeps always activity and molecular chains continue to grow in the narrow sense, but in general, it includes also quasi living polymerization in which those in which the terminal is deactivated and those in which the terminal is activated are in an equilibrium state to keep growth. The definition in the present invention is also the latter.

The "living radical polymerization process" has been recently studied by various groups. Examples thereof include a process using a cobalt porphyrin complex shown in J. Am. Chem. Soc. 1994, Vol. 116, pp 7943, a process using a radical scavenger such as a nitroxide compound shown in Macromolecules 1994, Vol. 27, pp 7228, "Atom Transfer Radical Polymerization (ATRP)" in which an organic halide is used as an initiator and a transition metal complex is a catalyst, and the like.

Among the "living radical polymerization processes", the "atom transfer radical polymerization process" in which a vinyl monomer is polymerized using an organic halide or a halogenated sulfonyl compound or the like as an initiator and a transition metal complex as a catalyst has advantages that the resulting polymer has at the ends halogen and the like which are comparatively advantageous for functional group conversion reaction and that the freedom of design of the initiator and catalyst is great in addition to the characteristic of the above-mentioned "living radical polymerization process"; therefore it is further preferable as the manufacturing process of the vinyl polymer having a specific functional group.

Examples of the "atom transfer radical polymerization process" include processes described in Matyjaszewski et al, J. Am. Chem. Soc., 1995, Vol. 117, pp 5614, Macromolecules 1995, Vol. 28, pp 7901, Science 1996, Vol. 272, pp 866, WO96/30421 pamphlet, WO97/18247 pamphlet, and Sawamoto et. al., Macromolecules, 1995, Vol. 28, pp 1721.

In the present invention, there is no limitation as to which process among these processes is used, but basically, the controlled radical polymerization process is utilized, and the living radical polymerization process is preferable because of easy control and in particular, the atom transfer radical polymerization process is more preferable.

Firstly, polymerization process using a chain transfer agent among the controlled radical polymerization processes is described.

Radical polymerization using a chain transfer agent (telomer) is not specifically limited, but the following two methods are exemplified as a process of obtaining the vinyl polymer having a terminal structure suitable for the present invention.

They are a process for obtaining a polymer having halogen terminal using halogenated hydrocarbon as a chain transfer agent shown in JP-A-4-132706 and a process for obtaining a polymer having hydroxyl group terminal using hydroxyl group-containing mercaptan or hydroxyl group-containing polysulfide or the like as a chain transfer agent shown in JP-A-61-271306, JP-B-2594402 and JP-A-54-47782.

Then, the living radical polymerization process is described.

Among them, firstly, a process of using a radical scavenger (radical capping agent) such as a nitroxide compound is described.

In the polymerization process, stable nitroxy free radical (=N—O.) is generally used as a radical capping agent. The compound is not specifically limited, but nitroxy free radicals from cyclic hydroxylamines, such as 2,2,6,6-substituted-1-piperidinyloxy radical and 2,2,5,5-substituted-1-pyrrolidinyloxy radical, are preferable. As the substituent, alkyl groups having at most 4 carbon atoms such as a methyl group and an ethyl group are suitable.

Specific examples of the nitroxy free radical compound are not specifically limited, but include 2,2,6,6-tetramethyl-1-piperidinyloxy radical (TEMPO), 2,2,6,6-tetraethyl-1-piperidinyloxy radical, 2,2,6,6-tetramethyl-4-oxo-1-piperidinyloxy radical, 2,2,5,5-tetramethyl-1-pyrrolidinyloxy radical, 1,1,3,3-tetramethyl-2-isoindolinyloxy radical, N,N-di-t-butylaminoxy radical.

Stable free radical such as galvinoxyl free radical may be used in place of the above-mentioned nitroxy free radicals.

The radical capping agent is used in combination with a radical generating agent. It is considered that the reaction product of the radical capping agent with radical generating agent becomes a polymerization initiator and thereby, the polymerization of an addition polymerizable monomer proceeds.

The proportion of both agents used is not specifically limited, but the radical generating agent is suitably 0.1 to 10 moles based on 1 mole of the radical capping agent.

As the radical generating agent, various compounds can be used, but peroxides capable of generating radical under the condition of polymerization temperature are preferable.

The peroxides are not specifically limited, but examples thereof include diacyl peroxides such as benzoyl peroxide and lauroyl peroxide; dialkyl peroxides such as dicumyl peroxide and di-tert-butyl peroxide; peroxy carbonates such as diisopropylperoxy dicarbonate and bis(4-t-butylcyclohexyl) peroxy dicarbonate; alkyl peresters such as t-butylperoxy octanoate and t-butylperoxy benzoate. In particular, benzoyl peroxide is preferable.

Further, radical generating azo compounds such as azobisisobutyronitrile can be used in place of peroxide.

As reported in Macromolecules, 1995, Vol. 28, pp 2993, an alkoxyamine compound described below may be used in place of using the radical capping agent and the radical generating agent in combination.

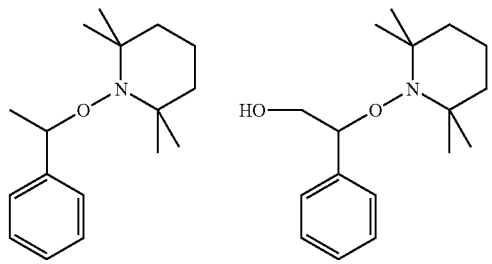

In the case that the alkoxyamine compound is used as an initiator, a polymer having a functional group at the end is obtained when a compound having a functional group such as hydroxyl group like the above-mentioned is used. When this is utilized in the present invention, a polymer having a functional group at the end can be obtained.

A monomer, a solvent, and polymerization conditions such as polymerization temperature which are used in polymerization using the radical capping agent such as the nitroxide compound are not specifically limited, but may be similar to those used in the atom transfer radical polymerization which is described below.

Then, the atom transfer radical polymerization process which is more preferable as the living radical polymerization process used in the present invention is described.

In the atom transfer radical polymerization, an organic halide, in particular, an organic halide having a high reactive carbon-halogen bond (for example, a carbonyl compound having halogen at α-position, a compound having halogen at a benzyl position), a halogenated sulfonyl compound, or the like is used as an initiator.

Specific examples thereof include:

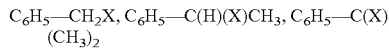

wherein $C_6H_5$ represents a phenyl group and X represents a chlorine atom, a bromine atom or an iodine atom;

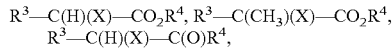

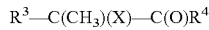

wherein $R^3$ and $R^4$ are a hydrogen atom, an alkyl group having 1 to 20 carbon atoms, an aryl group having 6 to 20 carbon atoms or an aralkyl group having 7 to 20 carbon atoms, and X is a chlorine atom, a bromine atom or an iodine atom; and

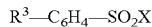

wherein $R^3$ is a hydrogen atom, an alkyl group having 1 to 20 carbon atoms, an aryl group having 6 to 20 carbon atoms or an aralkyl group having 7 to 20 carbon atoms, and X is a chlorine atom, a bromine atom or an iodine atom.

As the initiator of the atom transfer radical polymerization process, an organic halide or a halogenated sulfonyl compound having a functional group other than a functional group initiating polymerization can be also used. In such a case, a vinyl polymer having the functional group at one end of a main chain and the structure represented by general formula (1) at the other end of the main chain is produced.

Examples of the functional group include an alkenyl group, a crosslinking silyl group, a hydroxyl group, an epoxy group, an amino group, and an amide group.

The organic halide having an alkenyl group is not specifically limited, and there are exemplified those indicated by general formula (6):

$$R^6R^7C(X)-R^8-R^9-C(R^5)=CH_2 \quad (6)$$

wherein $R^5$ is a hydrogen atom or a methyl group, $R^6$ and $R^7$ are a hydrogen atom, an alkyl group having 1 to 20 carbon atoms, an aryl group having 6 to 20 carbon atoms, an aralkyl group having 7 to 20 carbon atoms or those which are mutually linked at another end, $R^8$ is —C(O)O— (an ester group), —C(O)— (a keto group) or an o-, m-, p-phenylene group, $R^9$ is a direct bond or a divalent organic group having 1 to 20 carbon atoms which may optionally contain at least one ether bond, and X is a chlorine atom, a bromine atom or an iodine atom.

Specific examples of the substituents $R^6$ and $R^7$ include a hydrogen atom, a methyl group, an ethyl group, a n-propyl group, an isopropyl group, a butyl group, a pentyl group, and a hexyl group. $R^6$ and $R^7$ may optionally be bonded at another end to form a ring skeleton.

Examples of the divalent organic group having 1 to 20 carbon atoms indicated by $R^9$ and which may optionally contain at least one ether bond include an alkylene group having 1 to 20 carbon atoms which may optionally contain at least one ether bond, and the like.

Specific examples of the organic halide having an alkenyl group indicated by general formula (6) include:

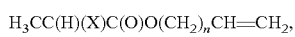

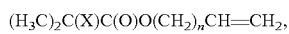

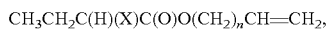

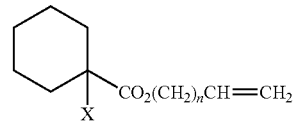

wherein X is a chlorine atom, a bromine atom or an iodine atom, and n is an integer of 0 to 20;

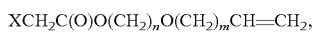

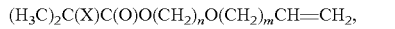

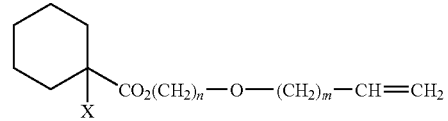

wherein X is a chlorine atom, a bromine atom or an iodine atom, n is an integer of 1 to 20 and m is an integer of 0 to 20;

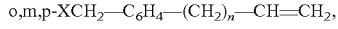

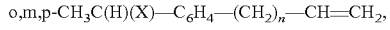

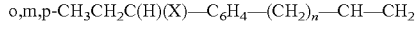

wherein X is a chlorine atom, a bromine atom or an iodine atom, and n is an integer of 0 to 20);

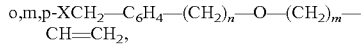

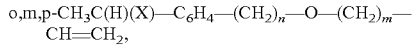

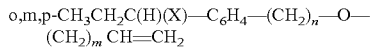

wherein X is a chlorine atom, a bromine atom or an iodine atom, n is an integer of 1 to 20 and m is an integer of 0 to 20;

o,m,p-XCH$_2$—C$_6$H$_4$—O—(CH$_2$)$_n$—CH=CH$_2$, o,m,p-CH$_3$C(H)(X)—C$_6$H$_4$—O—(CH$_2$)$_n$—CH=CH$_2$, o,m,p-CH$_3$CH$_2$C(H)(X)—C$_6$H$_4$—O—(CH$_2$)$_n$—CH=CH$_2$ wherein X is a chlorine atom, a bromine atom or an iodine atom, and n is an integer of 0 to 20); and o,m,p-XCH$_2$—C$_6$H$_4$—O—(CH$_2$)$_n$—O—(CH$_2$)$_m$—CH=CH$_2$, o,m,p-CH$_3$C(H)(X)—C$_6$H$_4$—O—(CH$_2$)$_n$—O—(CH$_2$)$_m$—CH=CH$_2$, o,m,p-CH$_3$CH$_2$C(H)(X)—C$_6$H$_4$—O—(CH$_2$)$_n$—O—(CH$_2$)$_m$—CH=CH$_2$ wherein X is a chlorine atom, a bromine atom or an iodine atom, n is an integer of 1 to 20 and m is an integer of 0 to 20.

The organic halides having an alkenyl group include further a compound indicated by general formula (7):

$$H_2C=C(R^5)—R^9—C(R^6)(X)—R^{10}—R^7 \quad (7)$$

wherein $R^5$, $R^6$, $R^7$, $R^9$ and X are the same as the above-mentioned, and $R^{10}$ represents a direct bond, —C(O)O— (an ester group), —C(O)— (a keto group) or an o-, m-, p-phenylene group.

$R^9$ is a direct bond or a divalent organic group having 1 to 20 carbon atoms (at least one ether bond may be optionally contained), but in case of the direct bond, a vinyl group is bonded to the carbon atom to which a halogen atom is bonded, representing an allyl halide. In this case, since the carbon-halogen bond is activated by the adjacent vinyl group, the compound does not always contain a C(O)O group, a phenylene group or the like as $R^{10}$, and $R^{10}$ may be a direct bond. When $R^9$ is not a direct bond, $R^{10}$ is preferably a C(O)O group, a C(O) group or a phenylene group to activate the carbon-halogen bond.

Specific examples of the compound indicated by general formula (7) include:

CH$_2$=CHCH$_2$X, CH$_2$=C(CH$_3$)CH$_2$X,

CH$_2$=CHC(H)(X)CH$_3$, CH$_2$=C(CH$_3$)C(H)(X)CH$_3$,

CH$_2$=CHC(X)(CH$_3$)$_2$, CH$_2$=CHC(H)(X)C$_2$H$_5$,

CH$_2$=CHC(H)(X)CH(CH$_3$)$_2$,

CH$_2$=CHC(H)(X)C$_6$H$_5$, CH$_2$=CHC(H)(X)CH$_2$C$_6$H$_5$,

CH$_2$=CHCH$_2$C(H)(X)—CO$_2$R,

CH$_2$=CH(CH$_2$)$_2$C(H)(X)—CO$_2$R,

CH$_2$=CH(CH$_2$)$_3$C(H)(X)—CO$_2$R,

CH$_2$=CH(CH$_2$)$_8$C(H)(X)—CO$_2$R,

CH$_2$=CHCH$_2$C(H)(X)—C$_6$H$_5$,

CH$_2$=CH(CH$_2$)$_2$C(H)(X)—C$_6$H$_5$,

CH$_2$=CH(CH$_2$)$_3$C(H)(X)—C$_6$H$_5$, wherein X is a chlorine atom, a bromine atom or an iodine atom, and R is an alkyl group having 1 to 20 carbon atoms, an aryl group or an aralkyl group.

Specific examples of the halogenated sulfonyl compound having an alkenyl group include:

o-,m-,p-CH$_2$=CH—(CH$_2$)$_n$—C$_6$H$_4$—SO$_2$X, o-,m-,p-CH$_2$=CH—(CH$_2$)$_n$—O—C$_6$H$_4$—SO$_2$X wherein X is a chlorine atom, a bromine atom or an iodine atom, and n is an integer of 0 to 20.

The organic halide having a crosslinking silyl group is not specifically limited and there are exemplified compounds indicated by general formula (8):

$$R^6R^7C(X)—R^8—R^9—C(H)(R^5)CH_2—[Si(R^{11})_{2-b}(Y)_b O]_m—Si(R^{12})_{3-a}(Y)_a \quad (8)$$

wherein $R^5$, $R^6$, $R^7$, $R^8$, $R^9$ and X are the same as the above-mentioned; each of $R^{11}$ and $R^{12}$ indicates an alkyl group having 1 to 20 carbon atoms, an aryl group, an aralkyl group or a triorganosiloxy group indicated by (R')$_3$SiO— (R' is a monovalent hydrocarbon group having 1 to 20 carbon atoms and three R's may be the same or different) and when at least two $R^{11}$s or $R^{12}$s exist, they may be the same or different; Y indicates a hydroxyl group or a hydrolyzable group and when at least two Ys exist, they may be the same or different; a is 0, 1, 2 or 3, b is 0, 1 or 2, m is an integer of 0 to 19, provided that a+mb23 is satisfied.

Specific examples of the compound indicated by general formula (8) include:

XCH$_2$C(O)O(CH$_2$)$_n$Si(OCH$_3$)$_3$,

CH$_3$C(H)(X)C(O)O(CH$_2$)$_n$Si(OCH$_3$)$_3$, (CH$_3$)$_2$C(X)C(O)O(CH$_2$)$_n$Si(OCH$_3$)$_3$,

XCH$_2$C(O)O(CH$_2$)$_n$Si(CH$_3$)(OCH$_3$)$_2$,

CH$_3$C(H)(X)C(O)O(CH$_2$)$_n$Si(CH$_3$)(OCH$_3$)$_2$, (CH$_3$)$_2$C(X)C(O)O(CH$_2$)$_n$Si(CH$_3$)(OCH$_3$)$_2$ wherein X is a chlorine atom, a bromine atom or an iodine atom, and n is an integer of 0 to 20;

XCH$_2$C(O)O(CH$_2$)$_n$O(CH$_2$)$_m$Si(OCH$_3$)$_3$,

H$_3$CC(H)(X)C(O)O(CH$_2$)$_n$O(CH$_2$)$_m$Si(OCH$_3$)$_3$, (H$_3$C)$_2$C(X)C(O)O(CH$_2$)$_n$O(CH$_2$)$_m$Si(OCH$_3$)$_3$,

CH$_3$CH$_2$C(H)(X)C(O)O(CH$_2$)$_n$O(CH$_2$)$_m$Si(OCH$_3$)$_3$,

XCH$_2$C(O)O(CH$_2$)$_n$O(CH$_2$)$_m$Si(CH$_3$)(OCH$_3$)$_2$,

H$_3$CC(H)(X)C(O)O(CH$_2$)$_n$O(CH$_2$)$_m$—Si(CH$_3$)(OCH$_3$)$_2$, (H$_3$C)$_2$C(X)C(O)O(CH$_2$)$_n$O(CH$_2$)$_m$—Si(CH$_3$)(OCH$_3$)$_2$,

CH$_3$CH$_2$C(H)(X)C(O)O(CH$_2$)$_n$O(CH$_2$)$_m$—Si(CH$_3$)(OCH$_3$)$_2$ wherein X is a chlorine atom, a bromine atom or an iodine atom, n is an integer of 1 to 20 and m is an integer of 0 to 20;

o,m,p-XCH$_2$—C$_6$H$_4$—(CH$_2$)$_2$Si(OCH$_3$)$_3$, o,m,p-CH$_3$C(H)(X)—C$_6$H$_4$—(CH$_2$)$_2$Si(OCH$_3$)$_3$, o,m,p-CH$_3$CH$_2$C(H)(X)—C$_6$H$_4$—(CH$_2$)$_2$Si(OCH$_3$)$_3$, o,m,p-XCH$_2$—C$_6$H$_4$—(CH$_2$)$_3$Si(OCH$_3$)$_3$, o,m,p-CH$_3$C(H)(X)—C$_6$H$_4$—(CH$_2$)$_3$Si(OCH$_3$)$_3$, o,m,p-CH$_3$CH$_2$C(H)(X)—C$_6$H$_4$—(CH$_2$)$_3$Si(OCH$_3$)$_3$, o,m,p-XCH$_2$—C$_6$H$_4$—(CH$_2$)$_2$—O—(CH$_2$)$_3$Si(OCH$_3$)$_3$, o,m,p-CH$_3$C(H)(X)—C$_6$H$_4$—(CH$_2$)$_2$—O—(CH$_2$)$_3$Si(OCH$_3$)$_3$, o,m,p-CH$_3$CH$_2$C(H)(X)—C$_6$H$_4$—(CH$_2$)$_2$—O—(CH$_2$)$_3$ Si(OCH$_3$)$_3$, o,m,p-XCH$_2$—C$_6$H$_4$—O—(CH$_2$)$_3$Si(OCH$_3$)$_3$, o,m,p-CH$_3$C(H)(X)—C$_6$H$_4$—O—(CH$_2$)$_3$Si(OCH$_3$)$_3$, o,m,p-CH$_3$CH$_2$C(H)(X)—C$_6$H$_4$—O—(CH$_2$)$_3$—Si(OCH$_3$)$_3$, o,m,p-XCH$_2$—C$_6$H$_4$—O—(CH$_2$)$_2$—O—(CH$_2$)$_3$—Si(OCH$_3$)$_3$, o,m,p-CH$_3$C(H)(X)—C$_6$H$_4$—O—(CH$_2$)$_2$—O—(CH$_2$)$_3$ Si(OCH$_3$)$_3$, o,m,p-CH$_3$CH$_2$C(H)(X)—C$_6$H$_4$—O—(CH$_2$)$_2$—O—(CH$_2$)$_3$Si(OCH$_3$)$_3$ wherein X is a chlorine atom, a bromine atom or an iodine atom.

The organic halides having a crosslinking silyl group include further compounds indicated by general formula (9):

$$(R^{12})_{3-a}(Y)_a Si—[OSi(R^{11})_{2-b}(Y)_b]_m—CH_2—C(H)(R^5)—R^9—C(R^6)(X)—R^{10}—R^7 \quad (9)$$

wherein $R^5$, $R^6$, $R^7$, $R^9$, $R^{10}$, $R^{11}$, $R^{12}$, a, b, X and Y are the same as the above-mentioned, and m is an integer of 0 to 19.

Specific examples of the compound indicated by general formula (9) include:

(CH$_3$O)$_3$SiCH$_2$CH$_2$C(H)(X)C$_6$H$_5$, (CH$_3$O)$_2$(CH$_3$)SiCH$_2$CH$_2$C(H)(X)C$_6$H$_5$, (CH$_3$O)$_3$Si(CH$_2$)$_2$C(H)(X)—CO$_2$R, (CH$_3$O)$_2$(CH$_3$)Si(CH$_2$)$_2$C(H)(X)—CO$_2$R, (CH$_3$O)$_3$Si(CH$_2$)$_3$C(H)(X)—CO$_2$R, (CH$_3$O)$_2$(CH$_3$)Si(CH$_2$)$_3$C(H)(X)—CO$_2$R, (CH$_3$O)$_3$Si(CH$_2$)$_4$C(H)(X)—CO$_2$R, (CH$_3$O)$_2$(CH$_3$)Si(CH$_2$)$_4$C(H)(X)—CO$_2$R, (CH$_3$O)$_3$Si(CH$_2$)$_9$C(H)(X)—CO$_2$R, (CH$_3$O)$_2$(CH$_3$)Si(CH$_2$)$_9$C(H)(X)—CO$_2$R, (CH$_3$O)$_3$Si(CH$_2$)$_3$C(H)(X)—C$_6$H$_5$, (CH$_3$O)$_2$(CH$_3$)Si(CH$_2$)$_3$C(H)(X)—C$_6$H$_5$, (CH$_3$O)$_3$Si(CH$_2$)$_4$C(H)(X)—C$_6$H$_5$, (CH$_3$O)$_2$(CH$_3$)Si(CH$_2$)$_4$C(H)(X)—C$_6$H$_5$ wherein X is a chlorine atom, a bromine atom or an iodine atom, and R is an alkyl group having 1 to 20 carbon atoms, an aryl group or an aralkyl group.

The above-mentioned organic halide or halogenated sulfonyl compound having a hydroxyl group is not specifically limited and those described below are exemplified.

HO—(CH$_2$)$_n$—OC(O)C(H)(R)(X)

wherein X is a chlorine atom, a bromine atom or an iodine atom, R is a hydrogen atom, an alkyl group having 1 to 20 carbon atoms, an aryl group or an aralkyl group, and n is an integer of 1 to 20.

The above-mentioned organic halide or halogenated sulfonyl compound having an amino group is not specifically limited and those described below are exemplified.

H$_2$N—(CH$_2$)$_n$—OC(O)C(H)(R)(X)

wherein X is a chlorine atom, a bromine atom or an iodine atom, R is a hydrogen atom, an alkyl group having 1 to 20 carbon atoms, an aryl group or an aralkyl group, and n is an integer of 1 to 20.

The above-mentioned organic halide or halogenated sulfonyl compound having an epoxy group is not specifically limited and those described below are exemplified.

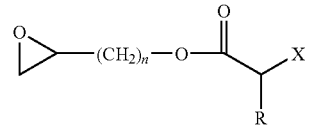

wherein X is a chlorine atom, a bromine atom or an iodine atom, R is a hydrogen atom, an allyl group having 1 to 20 carbon atoms, an aryl group or an aralkyl group, and n is an integer of 1 to 20.

The organic halide or halogenated sulfonyl compound having two or more initiation points is preferably used as an initiator in order to obtain a vinyl polymer having two or more groups represented by general formula (1) per molecule at the molecular ends. Specific examples thereof include:

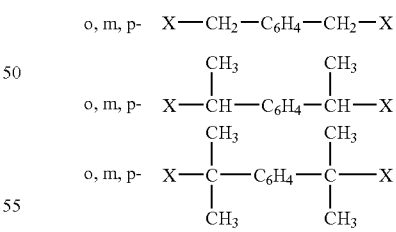

wherein C$_6$H$_4$ is a phenylene group, and X is a chlorine atom, a bromine atom or an iodine atom;

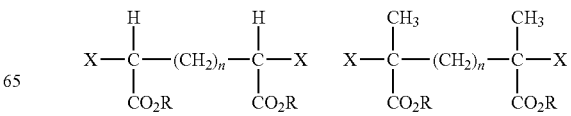

-continued

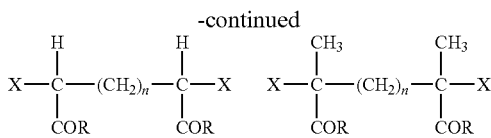

wherein R is an alkyl group having 1 to 20 carbon atoms, an aryl group or an aralkyl group, and n is an integer of 0 to 20, and X is a chlorine atom, a bromine atom or an iodine atom;

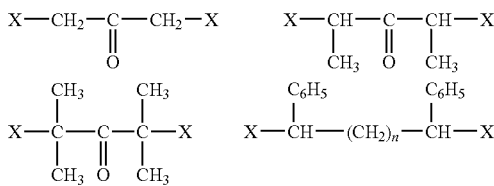

wherein X is a chlorine atom, a bromine atom or an iodine atom, and n is an integer of 0 to 20;

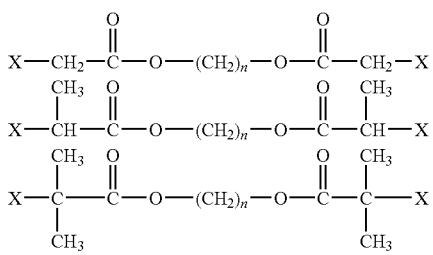

wherein n is an integer of 1 to 20, and X is a chlorine atom, a bromine atom or an iodine atom;

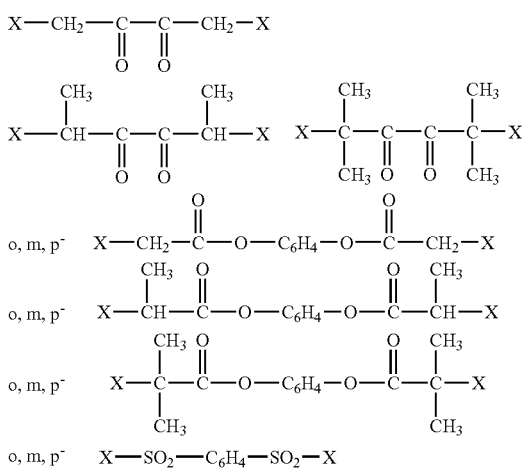

wherein X is a chlorine atom, a bromine atom or an iodine atom.

The vinyl monomer used for the polymerization is not specifically limited and all of them exemplified already can be preferably used.

The transition metal complex used as the polymerization catalyst is not specifically limited, but is preferably a metal complex in which an element of Groups 7, 8, 9, 10 or 11 of Periodic Table is a central metal, for example, complexes of copper, nickel, ruthenium and iron. As the more preferable complex, zerovalent copper complexes, monovalent copper complexes, divalent ruthenium complexes, divalent iron complexes and divalent nickel complexes are exemplified. Among these, copper complexes are preferable.

Specific examples of the monovalent copper compound include cuprous chloride, cuprous bromide, cuprous iodide, cuprous cyanide, cuprous oxide, and cuprous perchlorate.

When the copper compound is used, a ligand such as 2,2'-bipyridyl or its derivative, 1,10-phenanthroline or its derivative, or a polyamine such as tetramethylethylenediamine, pentamethyldiethylenetriamine or hexamethyltris(2-aminoethyl)amine can be added in order to enhance catalytic activity.

Further, tris(triphenylphosphine) complex ($RuCl_2(PPh_3)_3$) of divalent ruthenium chloride is also preferable as a catalyst.

When the ruthenium compound is used as a catalyst, an aluminum alkoxide can be added as an activating agent.

Further, bis(triphenylphosphine) complex ($FeCl_2(PPh_3)_2$) of divalent iron, bis(triphenylphosphine) complex ($NiCl_2(PPh_3)_2$) of divalent nickel and bis(tributylphosphine) complex ($NiBr_2(PBu_3)_2$) of divalent nickel are also preferable as the catalyst.

The polymerization can be carried out without a solvent or in various solvents.

Examples of the solvent include hydrocarbon solvents such as benzene and toluene; ether solvents such as diethyl ether and tetrahydrofuran; halogenated hydrocarbon solvents such as methylene chloride and chloroform; ketone solvents such as acetone, methyl ethyl ketone and methyl isobutyl ketone; alcohol solvents such as methanol, ethanol, propanol, isopropanol, n-butanol and tert-butanol; nitrile solvents such as acetonitrile, propionitrile and benzonitrile; ester solvents such as ethyl acetate and butyl acetate; carbonate solvents such as ethylene carbonate and propylene carbonate. These may be used alone or 2 or more solvents may be used in mixture.

Further, the polymerization can be carried out in a range of room temperature to 200° C. and preferably 50° to 150° C.

<Method for Introduction of Functional Group>

The method for manufacturing component (A) is not specifically limited, but for example, it can be produced by producing a vinyl polymer having a reactive functional group by the above-mentioned method and converting the reactive functional group to a substituent having a (meth)acryloyl group.

A method of converting the end of the vinyl polymer having a reactive functional group to a group represented by general formula (1) is described below.

The method of introducing a (meth)acryloyl group to the end of the vinyl polymer is not specifically limited, but those mentioned below are exemplified.

(Introduction Method 1)

A method wherein a vinyl polymer having a halogen group (halogen atom) at the end is reacted with a compound indicated by general formula (2):

$$M^+ \text{-}OC(O)C(R^a)\text{=}CH_2 \qquad (2)$$

wherein $R^a$ represents a hydrogen atom or an organic group having 1 to 20 carbon atoms, and $M^+$ represents an alkali metal ion or a quaternary ammonium ion)

As the vinyl polymer having a halogen group at the end, a vinyl polymer having an end group indicated by general formula (3):

$$—CR^1R^2X \quad (3)$$

wherein $R^1$ and $R^2$ represent a group bonded to the ethylenically unsaturated group of a vinyl monomer, and X represents a chlorine atom, a bromine atom or an iodine atom, is preferable.

(Introduction Method 2)

A method wherein a vinyl polymer having a hydroxyl group at the end is reacted with a compound indicated by general formula (4):

$$X^1C(O)C(R^a)\!=\!CH_2 \quad (4)$$

wherein $R^a$ represents a hydrogen atom or an organic group having 1 to 20 carbon atoms, and $X^1$ represents a chlorine atom, a bromine atom or a hydroxyl group.

(Introduction Method 3)

A method wherein a vinyl polymer having a hydroxyl group at the end is reacted with a diisocyanate compound and the residual isocyanate group is reacted with a compound indicated by general formula (5):

$$HO—R'—OC(O)C(R^a)\!=\!CH_2 \quad (5)$$

wherein $R^a$ represents a hydrogen atom or an organic group having 1 to 20 carbon atoms, and R' represents a divalent organic group having 2 to 20 carbon atoms.

The above-mentioned methods are specifically described below.

[Introduction Method 1]

The introduction method 1 is a method wherein a vinyl polymer having a halogen group at the end is reacted with a compound indicated by general formula (2).

The vinyl polymer having a halogen group at the end is not specifically limited, but those having an end group indicated by general formula (3) are preferable.

The vinyl polymer having a halogen group at the end, in particular, the vinyl polymer having an end group indicated by general formula (3), is produced by the method of polymerizing a vinyl monomer using the above-mentioned organic halide or halogenated sulfonyl compound as an initiator and the transition metal complex as a catalyst, or by the method of polymerizing a vinyl monomer using a halogen compound as a chain transfer agent, but the former is preferable.

The compound indicated by general formula (2) is not specifically limited.

As the organic group having 1 to 20 carbon atoms in $R^a$ in general formula (2), those like the above-mentioned are exemplified and specific examples like the above-mentioned are recited.

The $M^+$ in general formula (2) is the counter cation of oxy anion and examples thereof include alkali metal ions, quaternary ammonium ions.

Examples of the alkali metal ions include lithium ion, sodium ion, and potassium ion, and examples of the quaternary ammonium ions include tetramethylammonium ion, tetraethylammonium ion, tetrabenzylammonium ion, trimethyldodecylammonium ion, tetrabutylammonium ion, and dimethylpiperidinium ion. Among these, alkali metal ions are preferable and sodium ion and potassium ion are more preferable.

The amount of the compound indicated by general formula (2) used is preferably 1 to 5 equivalents, more preferably 1.0 to 1.2 equivalents, based on the end group indicated by general formula (3).

The solvent used for carrying out the reaction is not specifically limited, but a polar solvent is preferable because of nucleophilic displacement reaction. Preferable examples thereof include tetrahydrofuran, dioxane, diethyl ether, acetone, dimethylsulfoxide, dimethylformamide, dimethylacetoamide, hexamethylphosphoric triamide, and acetonitrile.

The reaction temperature is not specifically limited, but preferably 0° to 150° C. and more preferably 10° to 100° C.

[Introduction Method 2]

The introduction method 2 is a method wherein a vinyl polymer having a hydroxyl group at the end is reacted with a compound indicated by general formula (4).

The compound indicated by general formula (4) is not specifically limited.

As the organic group having 1 to 20 carbon atoms in $R^a$ in general formula (4), those like the above-mentioned are exemplified and specific examples like the above-mentioned are recited.

The vinyl polymer having a hydroxyl group at the end is produced by the method of polymerizing a vinyl monomer using the above-mentioned organic halide or halogenated sulfonyl compound as an initiator and the transition metal complex as a catalyst, or by the method of polymerizing a vinyl monomer using a compound having a hydroxyl group as a chain transfer agent, but the former is preferable.

The method of producing the vinyl polymer having a hydroxyl group at the end is not specifically limited, but for example, methods below are exemplified.

a) A method of reacting a compound having a polymerizable alkenyl group and a hydroxyl group in combination in one molecule which is indicated by general formula (10):

$$H_2C\!=\!C(R^{13})—R^{14}—R^{15}—OH \quad (10)$$

wherein $R^{13}$ represents a hydrogen atom or an organic group having 1 to 20 carbon atoms, $R^{14}$ represents —C(O)O— (an ester group) or an o-, m-, p-phenylene group, and $R^{15}$ represents a direct bond or a divalent organic group having 1 to 20 carbon atoms which may optionally contain at least one ether bond, and the like, as the second monomer when the vinyl polymer is synthesized by the living radical polymerization.

The above-mentioned $R^{13}$ is preferably a hydrogen atom or a methyl group. Those in which $R^{14}$ is an ester group are (meth)acrylate compounds and those in which $R^{14}$ is a phenylene group are styrene compounds. Specific examples of $R^{15}$ are the same as those of $R^9$.

The timing at which the compound having a polymerizable alkenyl group and a hydroxyl group in combination in one molecule is reacted is not specifically limited, but when rubbery nature is expected in particular, it is preferably reacted as the second monomer at the time of termination of the polymerization reaction or after completion of the reaction of a given monomer.

b) A method of reacting a compound having a less polymerizable alkenyl group and a hydroxyl group in combination in one molecule as the second monomer at the time of termination of the polymerization reaction or after completion of the reaction of a given monomer when the vinyl polymer is synthesized by the living radical polymerization.

Such a compound is not specifically limited, but examples thereof include compounds indicated by general formula (11):

$$H_2C=C(R^{13})-R^{16}-OH \quad (11)$$

wherein $R^{13}$ is the same as the above-mentioned and $R^{16}$ represents a divalent organic group having 1 to 20 carbon atoms which may optionally have at least one ether bond.

Specific examples of $R^{16}$ are the same as those of $R^9$.

The compounds indicated by general formula (11) are not specifically limited, but alkenyl alcohols such as 10-undecenol, 5-hexenol and allyl alcohol are preferable from the viewpoint of easy availability.

c) A method of introducing a hydroxyl group at the end by hydrolyzing the halogen atom of the vinyl polymer having at least one carbon-halogen bond indicated by general formula (3) which is obtained by the atom transfer radical polymerization, or by reacting the halogen atom of the vinyl polymer with a compound containing a hydroxyl group, according to such a method as disclosed in JP-A-4-132706.

d) A method of substituting halogen atom by reacting stabilized carbanion having a hydroxyl group which is indicated by general formula (12):

$$M^+C^-(R^{17})(R^{18})-R^{16}-OH \quad (12)$$

wherein $R^{16}$ and $M^+$ are the same as the above-mentioned and both of $R^{17}$ and $R^{18}$ are an electron attractive group stabilizing the carbanion $C^-$ or either of them is the electron attractive group and the other is a hydrogen atom, an alkyl group having 1 to 10 carbon atoms or a phenyl group, with a vinyl polymer having at least one carbon-halogen bond indicated by general formula (3) which is obtained by the atom transfer radical polymerization.

Examples of the electron attractive group include —$CO_2R$ (ester group), —C(O)R (keto group), —$CON(R)_2$ (amide group), —COSR (thioester group), —CN (nitrile group), and —$NO_2$ (nitro group), and —$CO_2R$, —C(O)R and —CN are preferable in particular. The substituent R is an alkyl group having 1 to 20 carbon atoms, an aryl group having 6 to 20 carbon atoms or an aralkyl group having 7 to 20 carbon atoms and preferably an alkyl group having 1 to 10 carbon atoms or a phenyl group.

e) A method of acting a simple metal such as zinc or an organometallic compound on a vinyl polymer having at least one carbon-halogen bond indicated by general formula (3) which is obtained by the atom transfer radical polymerization, preparing enolate anion and then reacting an aldehyde or ketone therewith.

f) A method of reacting a hydroxyl group containing compound represented by general formula (13):

$$HO-R^{16}-O^-M^+ \quad (13)$$

wherein $R^{16}$ and $M^+$ are the same as the above-mentioned, or a hydroxyl group containing compound indicated by general formula (14):

$$HO-R^{16}-C(O)O^-M^+ \quad (14)$$

wherein $R^{16}$ and $M^+$ are the same as the above-mentioned, with a vinyl polymer having at least one halogen atom at the polymer end, preferably halogen atom indicated by general formula (3), and substituting the above-mentioned halogen atom with a hydroxyl group containing substituent.

When a halogen atom does not participate in the method introducing a hydroxyl group like methods (a) and (b), method (b) is more preferable because the control is easier.

When a hydroxyl group is introduced by converting the halogen atom of the vinyl polymer having at least one carbon-halogen bond like methods (c) to (f), method (f) is more preferable because the control is easier.

The amount of the compound indicated by general formula (4) used is preferably 1 to 10 equivalents, more preferably 1 to 5 equivalents, based on the end hydroxyl group of the vinyl polymer.

The solvent used for carrying out the reaction is not specifically limited, but a polar solvent is preferable because of nucleophilic displacement reaction. Preferable examples thereof include tetrahydrofuran, dioxane, diethyl ether, acetone, dimethylsulfoxide, dimethylformamide, dimethylacetoamide, hexamethylphosphoric triamide, and acetonitrile.

The reaction temperature is not specifically limited, but Preferably 0° to 150° C. and more preferably 10° to 100° C.

(Introduction Method 3)

A method wherein a vinyl polymer having a hydroxyl group at the end is reacted with a diisocyanate compound and the residual isocyanate group is reacted with a compound indicated by general formula (5):

$$HO-R'-OC(O)C(R^a)=CH_2 \quad (5)$$

wherein $R^a$ represents a hydrogen atom or an organic group having 1 to 20 carbon atoms, and R' represents a divalent organic group having 2 to 20 carbon atoms.

As the organic group having 1 to 20 carbon atoms in $R^a$ in general formula (5), those like the above-mentioned are exemplified and specific examples like the above-mentioned are recited.

Examples of the divalent organic group having 2 to 20 carbon atoms indicated by R' in general formula (5) include alkylene groups having 2 to 20 carbon atoms (an ethylene group, a propylene group, a butylene group and the like), alkylene groups having 6 to 20 carbon atoms, and alkylene groups having 7 to 20 carbon atoms.

The compound indicated by general formula (5) is not specifically limited, but specifically preferable compounds are 2-hydroxypropyl methacrylate, and the like.

The vinyl polymer having a hydroxyl group at the end is mentioned above.

The diisocyanate compound is not specifically limited and any of those which have been conventionally known can be used. Specific examples thereof include tolylene diisocyanate, 4,4'-diphenylmethane diisocyanate, hexamethylene diisocyanate, xylylene diisocyanate, m-xylylene diisocyanate, 1,5-naphthalene diisocyanate, hydrogenated diphenylmethane diisocyanate hydrogenated tolylene diisocyanate, hydrogenated xylylene diisocyanate, and isophorone diisocyanate. These may be used alone or 2 or more of them may be used in combination. Further, blocked isocyanates may be used. Diisocyanate compounds having no aromatic ring such as hexamethylene diisocyanate and hydrogenated diphenylmethane diisocyanate are preferably used to obtain more satisfactory weather resistance.

The amount of the diisocyanate compound used is preferably 1 to 10 equivalents, more preferably 1 to 5 equivalents, based on the end hydroxyl group of the vinyl polymer.

The reaction solvent is not specifically limited, but aprotic solvent and the like are preferable.

The reaction temperature is not specifically limited, but preferably 0° to 250° C. and more preferably 20° to 200° C.

The amount of the compound indicated by general formula (5) used is preferably 1 to 10 equivalents, more preferably 1 to 5 equivalents, based on the residual isocyanate group.

<Component (B)>

The curable composition of the present invention comprises an epoxy compound and/or an oxetane compound as the component (B).

The epoxy compound of the component (B) plays roles of lowering the viscosity of component (A), improving workability and improving the strength of a cured article.

The epoxy compound may be any one as long as it is a compound having an epoxy group, but for example, a bisphenol type epoxy resin and an alicyclic epoxy resin are exemplified.

Specific examples of the bisphenol type epoxy resin include a bisphenol A type epoxy resin, a bisphenol F type epoxy resin, a bisphenol AD type epoxy resin, a hydrogenated bisphenol A type epoxy resin, and a hydrogenated bisphenol F type epoxy resin.

The hydrogenated type means those in which a benzene ring portion is reduced to a cyclohexyl ring by hydrogenation.

Further, as the alicyclic epoxy resin, compounds having a cyclohexene oxide group, a tricyclodecene oxide group, a cyclopentene oxide group and the like are typical. Specific examples thereof include vinyl cyclohexene diepoxide, vinyl cyclohexene monoepoxide, 3,4-epoxycyclohexylmethyl-3, 4-epoxycyclohexane carboxylate, 2-(3,4-epoxycyclohexyl-5,5-spiro-3,4-epoxy)cyclohexane-m-dioxane, bis(3,4-epoxycyclohexyl)adipate, bis(3,4-epoxycyclohexylmethylene) adipate.

It is preferable that the epoxy resin does not have an aromatic ring for preventing absorption of light to inhibit curing and coloring after curing.

The oxetane compound of the component (B) plays roles of lowering the viscosity of the component (A), improving workability and improving the strength of a cured article.

The oxetane compound is not specifically limited. Specific examples thereof include 3-ethyl-3-hydroxymethyloxetane, 3-(meth)allyloxymethyl-3-ethyloxetane, (3-ethyl-3-oxetanylmethoxy)methylbenzene, 4-fluoro-[1-(3-ethyl-3-oxetanylmethoxy)methyl]benzene, 4-methoxy-[1-(3-ethyl-3-oxetanylmethoxy)methyl]benzene, [1-(3-ethyl-3-oxetanylmethoxy)ethyl]phenyl ether, isobutoxymethyl(3-ethyl-3-oxetanylmethyl)ether, isobornyloxyethyl(3-ethyl-3-oxetanylmethyl)ether, isobornyl(3-ethyl-3-oxetanylmethyl)ether, 2-ethylhexyl(3-ethyl-3-oxetanylmethyl)ether, ethyldiethylene glycol(3-ethyl-3-oxetanylmethyl)ether, dicyclopentadiene(3-ethyl-3-oxetanylmethyl)ether, dicyclopentenyloxyethyl(3-ethyl-3-oxetanylmethyl)ether, dicyclopentenylethyl(3-ethyl-3-oxetanylmethyl)ether, tetrahydrofurfuryl(3-ethyl-3-oxetanylmethyl)ether, tetrabromophenyl (3-ethyl-3-oxetanylmethyl)ether, 2-tetrabromophenoxyethyl (3-ethyl-3-oxetanylmethyl)ether, tribromophenyl(3-ethyl-3-oxetanylmethyl)ether, 2-tribromophenoxyethyl(3-ethyl-3-oxetanylmethyl)ether, 2-hydroxyethyl(3-ethyl-3-oxetanylmethyl)ether, 2-hydroxypropyl(3-ethyl-3-oxetanylmethyl)ether, butoxyethyl(3-ethyl-3-oxetanylmethyl)ether, pentachlorophenyl(3-ethyl-3-oxetanylmethyl)ether, pentabromophenyl(3-ethyl-3-oxetanylmethyl)ether, bornyl(3-ethyl-3-oxetanylmethyl) ether, 3,7-bis(3-oxetanyl)-5-oxanonane, 1,4-bis[(3-ethyl-3-oxetanylmethoxy)methyl]benzene, 1,2-bis[(3-ethyl-3-oxetanylmethoxy)methyl]ethane, 1,2-bis[(3-ethyl-3-oxetanylmethoxy)methyl]propane, ethylene glycol bis(3-ethyl-3-oxetanylmethyl)ether, dicyclopentenyl bis(3-ethyl-3-oxetanylmethyl)ether, triethylene glycol bis(3-ethyl-3-oxetanylmethyl)ether, tetraethylene glycol bis(3-ethyl-3-oxetanylmethyl)ether, tricyclodecanediyldimethylene bis(3-ethyl-3-oxetanylmethyl)ether, 1,4-bis[(3-ethyl-3-oxetanylmethoxy)methyl]butane, 1,6-bis[(3-ethyl-3-oxetanylmethoxy)methyl]hexane, polyethylene glycol bis(3-ethyl-3-oxetanylmethyl)ether, EO modified bisphenol A bis(3-ethyl-3-oxetanylmethyl)ether, PO modified bisphenol A bis(3-ethyl-3-oxetanylmethyl)ether, EO modified hydrogenated bisphenol A bis(3-ethyl-3-oxetanylmethyl)ether, PO modified hydrogenated bisphenol A bis(3-ethyl-3-oxetanylmethyl)ether, EO modified bisphenol F bis(3-ethyl-3-oxetanylmethyl)ether, trimethylolpropane tris(3-ethyl-3-oxetanylmethyl)ether, pentaerythritol tris(3-ethyl-3-oxetanylmethyl) ether, pentaerythritol tetrakis(3-ethyl-3-oxetanylmethyl) ether, dipentaerythritol hexakis(3-ethyl-3-oxetanylmethyl) ether, dipentaerythritol pentakis(3-ethyl-3-oxetanylmethyl) ether, dipentaerythritol tetrakis(3-ethyl-3-oxetanylmethyl) ether, caprolactone modified dipentaerythritol hexakis(3-ethyl-3-oxetanylmethyl)ether, ditrimethylolpropane tetrakis (3-ethyl-3-oxetanylmethyl)ether.

It is preferable that the oxetane compound does not have an aromatic ring for preventing absorption of light to inhibit curing and coloring after curing.

The amount of component (B) used is preferably 10 to 200 parts by weight (hereinafter referred to as "parts"), more preferably 20 to 150 parts, based on 100 parts of component (A). When the amount of component (B) is less than 10 parts, effect of improving strength tends to be inadequate and when it exceeds 200 parts, elongation tends to be not adequately obtained.

<Component (C)>

The radical photopolymerization initiator of component (C) is used for photo-curing of component (C).

The photopolymerization initiator of component (C) is not specifically limited. Specific examples thereof include acetophenone, propiophenone, benzophenone, xanthol, fluorlein, benzaldehyde, anthraquinone, triphenylamine, carbazole, 3-methylacetophenone, 4-methylacetophenone, 3-pentylacetophenone, 2,2-diethoxyacetophenone, 4-methoxyacetophenone, 3-bromoacetophenone, 4-allylacetophenone, p-diacetylbenzene, 3-methoxybenzophenone, 4-methylbenzophenone, 4-chlorobenzophenone, 4,4'-dimethoxybenzophenone, 4-chloro-4'-benzylbenzophenone, 3-chloroxanthone, 3,9-dichloroxanthone, 3-chloro-8-nonylxanthone, benzoyl, benzoin methyl ether, benzoin butyl ether, bis(4-dimethylaminophenyl)ketone, benzyl methoxy ketal, and 2-chlorothioxanthone.

These initiators may be used alone or may be used in combination with other compound. Specifically, examples of the combination include an combination with an amine such as diethanolmethylamine, dimethylethanolamine or triethanolamine; an combination with an iodonium salt such as diphenyliodonium chloride in addition to the foregoing combination; an combination with a dye such as methylene blue and an amine, and the like.

Further, when the photopolymerization initiator is used, a Polymerization inhibitor such as hydroquinone, hydroquinone monomethyl ether, benzoquinone or para-tertiary-butylcathecol can be added if necessary.

Further, as a near infrared photopolymerization initiator, a near infrared absorptive cation dye may be used.

Preferable examples of the near infrared absorptive cation dye include those which are excited by light energy in a range of 650 to 1,500 nm, for example, near infrared absorptive cation dye-borate anion complex disclosed in JP-A-3-111402, JP-A-5-194619 and the like. This complex is further preferably used in combination with a boron sensitizer.

Since the amount of the radical photopolymerization initiator used is enough to optically functionalize the system slightly, it is not specifically limited, but is preferably 0.001 to 10 parts based on 100 parts of component (A).

<Component (D)>

The cationic photopolymerization initiator of component (D) is a component for inducing the ring opening of the epoxy compound and/or oxetane compound of component (B) and an arbitrary compound which can induce the ring opening of an epoxy group and an oxetane ring by irradiation of light can be used.

Specific examples of the cationic photopolymerization initiator include aromatic diazonium salts, aromatic iodonium salts, and aromatic sulfonium salts. More specific examples include p-methoxybenzene diazonium hexafluoroantimonate, triphenylsulfonium hexafluoroantimonate, triphenylsulfonium hexafluoroarsinate, and triphenylsulfonium hexafluoroborate. Usable commercial products include OPTOMER SP150, OPTOMER SP170 and OPTOMER SP172 manufactured by ASAHI DENKA Co., Ltd., UVE1014 manufactured by General Electric Co., CD1012 manufactured by Sortomer Co., Inc. and the like. These initiators may used alone and 2 or more of them may be used in combination.

The content of the cationic photopolymerization initiator is not specifically limited, but is preferably 0.1 to 15 parts based on 100 parts of the epoxy compound and/or oxetane compound of component (B) from the viewpoint of curability and more preferably 0.3 to 8.0 parts based on 100 parts of the epoxy compound and/or oxetane Compound of component (B) from the viewpoint of the physical property balance of a cured article.

<Component (E)>

The compound having both of an epoxy group and a (meth)acryloy, group in the molecule of component (E) is not always necessary, but it can be used as a compound for crosslinking components (A) and (B) in order to improve mechanical strength and elongation.

The component (E) is not specifically limited as long as it is a compound having both of an epoxy group and a (meth)acryloyl group in the molecule, but glycidyl methacrylate is preferable from the viewpoint of availability and the like.

The amount of component (E) used is preferably 0.1 to 30 parts, more preferably 0.5 to 20 parts, based on 100 parts of the total of components (A) and (B).

<Curable Composition>

The curable composition of the present invention is a composition curable by radical photo curing and cationic photo curing in combination, comprising the above-mentioned component (A), component (B), component (C) and component (D) as the essential components.

When the viscosity of the composition becomes high, workability is remarkably lowered in every application. Further, since heat resistance and seal property are required for an in-place shaping gasket, the compression set determined under the above-mentioned conditions is preferably 30% or less. A polymerizable monomer and/or oligomer, various additives or organic solvent can be optionally used in combination for the purpose of the improvement of surface curability, the addition of toughness or the improvement of workability due to reduction of viscosity.

As the above-mentioned polymerizable monomer and/or oligomer, a monomer and/or oligomer having a radical polymerizable group, or a monomer and/or oligomer having an anion polymerizable group is preferable from the viewpoint of curability.

Examples of the radical polymerizable group include a (meth)acryloyl group such as a (meth)acrylic group, a styrene group, an acrylonitrile group, a vinyl ester group, an N-vinyl pyrrolidone group, an acrylamide group, a conjugated diene group, a vinyl ketone group, and a vinyl chloride group. Among these, those having a (meth)acrylic group which are similar to the polymer used in the present invention are preferable.

Examples of the anion polymerizable group include a (meth)acryloyl group such as a (meth)acrylic group, a styrene group, an acrylonitrile group, an N-vinyl pyrrolidone group, an acrylamide group, a conjugated diene group, and a vinyl ketone group. Among these, those having a (meth)acryloyl group which are similar to the polymer used in the present invention are preferable.

Specific examples of the monomer include a (meth)acrylate monomer, a cyclic acrylate, N-vinyl pyrrolidone, styrene monomer, acrylonitrile, N-vinyl pyrrolidone, acrylamide monomer, a conjugated diene monomer, a vinyl ketone monomer, and a polyfunctional monomer.

Examples of the (meth)acrylate monomer include methyl (meth)acrylate, ethyl(meth)acrylate, n-propyl(meth)acrylate, isopropyl(meth)acrylate, n-butyl(meth)acrylate, isobutyl (meth)acrylate, tert-butyl(meth)acrylate, n-pentyl(meth)acrylate, n-hexyl(meth)acrylate, cyclohexyl(meth)acrylate, n-heptyl(meth)acrylate, n-octyl(meth)acrylate, isooctyl (meth)acrylate, 2-ethylhexyl(meth)acrylate, nonyl(meth) acrylate, isononyl(meth)acrylate, decyl(meth)acrylate, dodecyl(meth)acrylate, phenyl(meth)acrylate, tolyl(meth) acrylate, benzyl(meth)acrylate, 2-methoxyethyl(meth) acrylate, 3-methoxybutyl(meth)acrylate, 2-hydroxyethyl (meth)acrylate, 2-hydroxypropyl(meth)acrylate, stearyl (meth)acrylate, glycidyl(meth)acrylate, 2-aminoethyl(meth) acrylate, γ-(methacryloyloxy)propyltrimethoxysilane, an ethylene oxide adduct of (meth)acrylic acid, trifluoromethylmethyl(meth)acrylate, 2-trifluoromethylethyl(meth)acrylate, 2-perfluoroethylethyl(meth)acrylate, 2-perfluoroethyl-2-perfluorobutylethyl(meth)acrylate, 2-perfluoroethyl(meth) acrylate, perfluoromethyl(meth)acrylate, di-perfluoromethylmethyl(meth)acrylate, 2-perfluoromethyl-2-perfluoroethylethyl(meth)acrylate, 2-perfluorohexylethyl (meth)acrylate, 2-perfluorodecylethyl(meth)acrylate, and 2-perfluorohexadecylethyl(meth)acrylate. Further, compounds indicated by the formulae below can be exemplified. Herein, n indicates an integer of 0 to 20 in the formulae below.

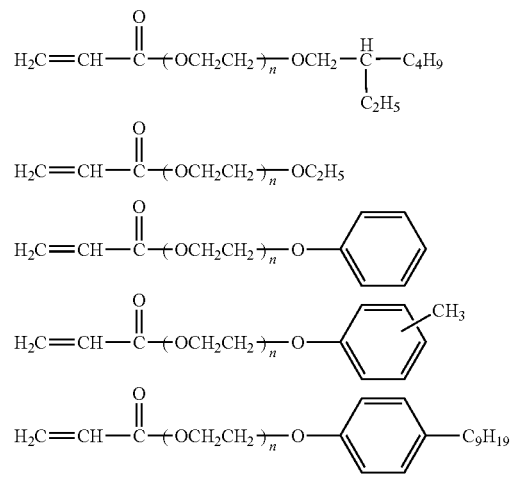

-continued

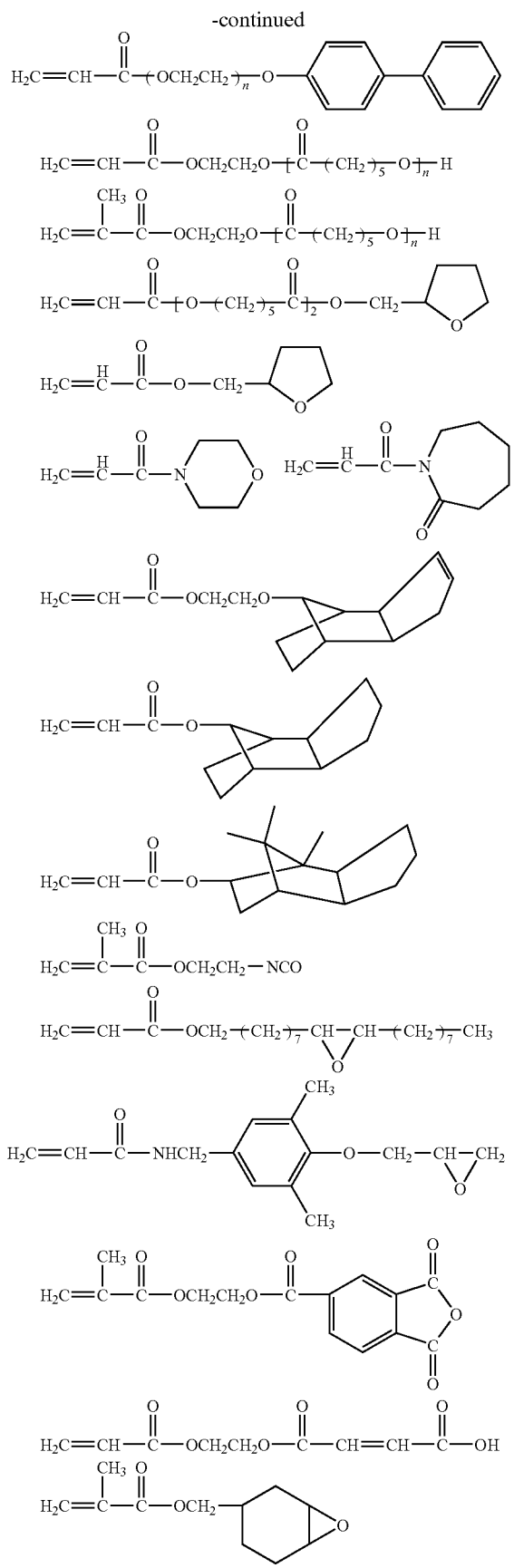

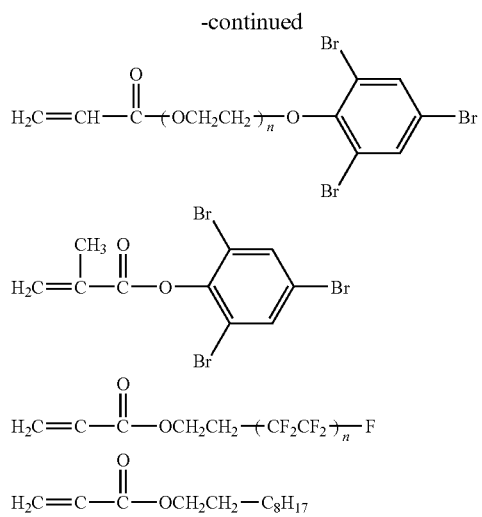

The styrene monomers include styrene, α-methylstyrene and the like; the acrylamide monomers include acrylamide, N,N-dimethylacrylamide and the like; the conjugated diene monomers include butadiene, isoprene and the like; and the vinyl ketone monomers include methyl vinyl ketone and the like.

Examples of the polyfunctional monomer include trimethylolpropane triacrylate, neopentylglycol polypropoxy diacrylate, trimethylolpropane polyethoxy triacrylate, bisphenol F polyethoxy diacrylate, bisphenol A polyethoxy diacrylate, dipentaerythritol polyhexanolide hexaacrylate, tris(hydroxyethyl)isocyanurate polyhexanolide triacrylate, tricyclodecanedimethylol diacrylate, 2-(2-acryloyloxy-1,1-dimethyl)-5-ethyl-5-acryloyloxymethyl-1,3-dioxane, tetrabromobisphenol A diethoxy diacrylate, 4,4-dimercaptodiphenylsulfide dimethacrylate, polytetraethylene glycol diacrylate, 1,9-nonanediol diacrylate, and ditrimethylolpropane tetraacrylate.

Examples of the oligomer include epoxy acrylate resins such as a bisphenol A type epoxy acrylate resin, a phenolnovolac type epoxy acrylate resin and a cresol novolac type epoxy acrylate resin; a COOH modified epoxy acrylate resin; urethane acrylate resins obtained by reacting a urethane resin obtained from a polyol(polytetramethylene glycol, polyester diol from ethylene glycol and adipic acid, ε-caprolactone modified polyester diol, polypropylene glycol, polyethylene glycol, polycarbonate diol, hydrogenated polyisoprene with end hydroxy group, polybutadiene with end hydroxy group, Polyisobutylene with end hydroxy group, and the like) and an organic isocyanate (tolylene diisocyanate, isophorone diisocyanate, diphenylmethane diisocyanate, hexamethylene diisocyanate, xylylene diisocyanate, and the like), with (meth)acrylate containing a hydroxy group (hydroxyethyl (meth)acrylate, hydroxypropyl(meth)acrylate, hydroxybutyl (meth)acrylate, pentaerythritol triacrylate, and the like); resins in which a (meth)acrylic group is introduced into the above-mentioned polyol through ester bond; polyester acrylate resins; Poly(meth)acrylic acrylate resins (poly(meth)acrylic acid ester resins having a polymerizable reactive group).

The number average molecular weight of the monomer and/or oligomer having a (meth)acryloyl group is preferably 5,000 or less. When the monomer is used for the reduction of viscosity to improve surface curability and workability, the molecular weight thereof is more preferably 1,000 or less because satisfactory compatibility.

The amount of the monomer and/or oligomer used is preferably 1 to 200 parts, more preferably 5 to 100 parts, based on 100 parts of the total of components (A) and (B).

As the organic solvent, solvents with a boiling point of 50° to 180° C. are preferable because workability on coating and drying property before and after curing are superior. Specific examples thereof include alcohol solvents such as methanol, ethanol, isopropanol, n-butanol and isobutanol; ester solvents such as methyl acetate, ethyl acetate, butyl acetate, ethylene glycol monoethyl ether, ethylene glycol monoethyl ether acetate and ethylene glycol monobutyl ether; ketone solvents such as acetone, methyl ethyl ketone and methyl isobutyl ketone; aromatic solvents such as toluene and xylene; and cyclic ethers such as dioxane. These solvents may be used alone or 2 or more of them may be used in mixture.

For the composition of the present invention, it is useful to add reinforcing silica from the viewpoint of the improvement of strength of cured product.

Examples of the reinforcing silica include fumed silica and precipitated silica. Among these, silica with a particle size of 50 μm or less and a specific area of 80 $m^2/g$ or more is preferable from the viewpoint of the effect of reinforcement.

Further, surface-treated silica, for example, silica surface-treated with organosilane, organosilazane, diorganocyclopolysiloxane or the like, is more preferable because flowability Suitable for shaping is easily realized.

Specific examples of the reinforcing silica is not specifically limited, but include AEROSIL manufactured by Nippon Aerosil Co. which is one of fumed silica, and Nipsil manufactured by Nippon Silica Industrial Co. Ltd. which is one of precipitated silica.

The reinforcing silica may be used alone and 2 or more of them may be used in combination.

The addition amount of the reinforcing silica is not specifically limited, but is preferably from 0.1 to 100 parts, more preferably from 0.5 to 80 parts and most preferably from 1 to 50 parts, based on 100 parts of the total of components (A) and (B). When the amount is less than 0.1 part, the improvement effect of reinforcing property is occasionally inadequate. When the amount exceeds 100 parts, the workability of the composition is occasionally lowered.

Various fillers may be used for the composition of the present invention if necessary, in addition to the reinforcing silica.

Examples of the fillers are not specifically limited, but include reinforcing fillers such as wood flour, pulp, cotton chip, asbestos, glass fiber, carbon fiber, mica, walnut shell powder, rice husk shell powder, graphite, diatom earth, white earth, dolomite, silicic anhydride, hydrated silicic acid and carbon black; filling agents such as heavy calcium carbonate, colloidal calcium carbonate, magnesium carbonate, diatom earth, calcined clay, clay, talc, titanium oxide, bentonite, organic bentonite, ferric oxide, red iron oxide, aluminum fine Powder, flint powder, zinc oxide, active zinc oxide, zinc powder, zinc carbonate and Shirasu balloon; fibrous filling agents such as asbestos, glass fiber and glass filament, carbon fiber, Kevlar fiber and Polyethylene fiber. Among these filling agents, carbon black, calcium carbonate, titanium oxide, talc and the like are preferable. Further, when a cured article with low strength and large elongation is desired, filling agents mainly selected from titanium oxide, calcium carbonate, talc, ferric oxide, zinc oxide, Shirasu balloon and the like can be added.

When the specific surface area of calcium carbonate is small, the improvement effects of strength at break, elongation at break and adhesiveness and weather resistant adhesiveness of the cured article are occasionally inadequate in general. The larger the value of the specific surface area, the greater the improvement effects of strength at break, elongation at break and adhesiveness and weather resistant adhesiveness of the cured article are. As calcium carbonate, those surface-treated using a surface treating agent are preferably used. When surface-treated calcium carbonate is used, it is considered that the workability of the composition of present invention is improved and the improvement effects of adhesiveness and weather resistant adhesiveness of the curable composition is further improved, as compared to calcium carbonate which is not surface-treated.

As the surface treating agents, organic substances such as fatty acid, fatty acid soap and fatty acid ester, and various surfactants, various coupling agents such as a silane coupling agent and a titanate coupling agent are used. Specific examples thereof include, not limited to, fatty acids such as caproic acid, caprylic acid, pelargonic acid, capric acid, undecanoic acid, lauric acid, myristic acid, palmitic acid, stearic acid, behenic acid and oleic acid; and sodium salts and potassium salts of those fatty acids, and alkyl esters of those fatty acids.

Specific examples of the surfactant include sulfate type anion surfactants such as sodium salts and potassium salts of polyoxyethylene alkyl ether sulfate and long chain alcohol sulfates; sulfonic acid type anion surfactants such as sodium salts and potassium salts of alkylbenzene sulfonic acid, alkylnaphthalene sulfonic acid, paraffin sulfonic acid, α-olefin sulfonic acid and alkyl sulfosuccinic acid.

The amount of the surface treating agent used is preferably in a range of 0.1 to 20% by weight (hereinafter referred to as "%"), more Preferably in a range of 1 to 5%, based on calcium carbonate. When the amount is less than 0.1%, the improvement effects of workability and adhesiveness and weather resistant adhesiveness are not occasionally adequate. When the amount exceeds 20%, the storage stability of the curable composition is occasionally lowered.

When calcium carbonate is used, the type thereof is not specifically limited, but colloidal calcium carbonate is preferably used when the improvement effects of the thixotropy of the composition and the strength at break, elongation at break, adhesiveness and weather resistant adhesiveness of a cured article and the like are especially expected.

On the other hand, heavy calcium carbonate is occasionally added for reducing the viscosity of the composition, increasing the quantity of the composition and lowering cost. When heavy calcium carbonate is used, those described below can be used according to requirement.

The heavy calcium carbonate means that obtained by mechanically pulverizing and processing natural chalk, marble stone, lime stone or the like. Pulverization process includes a wet process and a dry process, but a wet pulverization product is often not preferable because the storage stability of the composition of the present invention is often deteriorated. Sieving of heavy calcium carbonate gives products having various average particle sizes. The specific surface area of calcium carbonate is not specifically limited, but when the improvement effects of the strength at break, elongation at break, adhesiveness and weather resistant adhesiveness of a cured article are expected, the specific surface area is preferably at least 1.5 $m^2/g$ and at most 50 $m^2/g$, more preferably at least 2 $m^2/g$ and at most 50 $m^2/g$, further more preferably at least 2.4 $m^2/g$ and at most 50 $m^2/g$ and most preferably at least 3 $m^2/g$ and at most 50 $m^2/g$. When the specific surface area is less than 1.5 $m^2/g$, the improvement effects are occasionally inadequate. Of course, when the viscosity is merely reduced and the purpose is only to increase the quantity of the composition, the specific surface area is not limited.

The specific surface area means a measurement obtained by an air permeation method (a method of determining the specific surface area from the degree of permeation of air through powder filling layer) which is carried out according to JIS K 5101 as a measuring method. As the measuring device, a specific surface area measuring device SS-100 manufactured by Shimadzu Corporation is preferably used.

These filling agents may be used alone or 2 or more of them may be also used in combination according to purpose and requirement. The combination is not specifically limited, but, for example, when heavy calcium carbonate with a specific surface area of at least 1.5 m$^2$/g and colloidal calcium carbonate are used in combination, the increase of viscosity of the composition is suppressed to a certain degree and the improvement effects of the strength at break, elongation at break, adhesiveness and weather resistant adhesiveness of a cured article can be greatly expected.

When the filling agent is used, the amount of the filling agent is preferably in a range of 5 to 1,000 parts, more preferably in a range of 10 to 500 parts and most preferably in a range of 20 to 300 parts, based on 100 parts of the total of components (A) and (B). When the amount is less than 5 parts, the improvement effects of the strength at break, elongation at break, adhesiveness and weather resistant adhesiveness of a cured article are occasionally inadequate and when it exceeds 1,000 parts, the workability of the curable composition is occasionally lowered. The filling agents may be used alone or 2 or more of them may be used in combination.

Since the curable composition of the present invention comprises preferably (meth)acrylic polymers as a main component, the addition of a tackifier resin is not always necessary, but various kinds of tackifier resins can be used if necessary. Specific examples thereof include a phenol resin, a modified phenol resin, a cyclopentadiene-phenol resin, a xylene resin, a coumarone resin, a petroleum resin, a terpene resin, a terpene-phenol resin, and a rosin ester resin.

Various additives such as an anti-aging agent, a plasticizer, a physical property modifier and a solvent may be added to modify physical properties of the curable composition of the present invention.

Since the acrylic polymer is a polymer naturally superior in heat resistance, weather resistance and durability, an anti-aging agent is not always necessary, but a conventionally known antioxidant or a light stabilizer can be suitably used. Further, the anti-aging agent can be also used for polymerization control at polymerization and the control of physical properties. As the antioxidant, various kinds have been known and those described in "Antioxidant Handbook" published by Taiseisya Ltd., "Degradation and Stabilization of Polymer Material" (235 to 242) published by CMC Books Co. and the like are exemplified, but the antioxidant to be used in the present invention is not specifically limited to these. Examples thereof include thio ethers such as MARK PEP-36 and MARK AO-23 (both above are manufactured by Adeka Argus Chemical Co., Ltd.), phosphorous antioxidants such as Irgafos 38, Irgafos 168 and Irgafos P-EPQ (all above are manufactured by Chiba-Geigy Japan Ltd.). Among these, hindered phenol compounds shown below are preferable.

Specific examples of the hindered phenol compounds below include 2,6-di-tert-butyl-4-methylphenol, 2,6-di-tert-butyl-4-ethylphenol, mono(or di or tri)(α-methylbenzyl)phenol, 2,2'-methylenebis(4-ethyl-6-tert-butylphenol), 2,2'-methylenebis(4-methyl-6-tert-butylphenol), 4,4'-butylidenebis (3-methyl-6-tert-butylphenol), 4,4-thiobis(3-methyl-6-tert-butylphenol), 2,5-di-tert-butylhydroquinone, 2,5-di-tert-amylhydroquinone, triethylene glycol bis-[3-(3-tert-butyl-5-methyl-4-hydroxyphenyl)propionate], 1,6-hexanediol bis[3-(3,5-di-tert-butyl-4-hydroxyphenyl)propionate], 2,4-bis-(n-octylthio)-6-(4-hydroxy-3,5-di-tert-butylanilino)-1,3,5-triazine, pentaerythritol tetrakis[3-(3,5-di-tert-butyl-4-hydroxyphenyl)-propionate], 2,2-thio-diethylenebis[3-(3,5-di-tert-butyl-4-hydroxyphenyl)propionate], octadecyl 3-(3,5-di-tert-butyl-4-hydroxyphenyl)propionate, N,N'-hexamethylenebis(3,5-di-tert-butyl-4-hydroxy-hydrocinnamamide), diethyl(3,5-di-tert-butyl-4-hydroxybenzylphosphonate), 1,3,5-trimethyl-2,4,6-tris(3,5-di-tert-butyl-4-hydroxybenzyl)benzene, calcium bis(ethyl 3,5-di-tert-butyl-4-hydroxybenzylsulfonate), tris-(3,5-di-tert-butyl-4-hydroxybenzyl)isocyanurate, 2,4-2,4-bis[(octylthio)methyl]o-cresol, N,N'-bis[3-(3,5-di-tert-butyl-4-hydroxyphenyl)propionyl]hydrazine, tris(2,4-di-tert-butylphenyl)phosphite, 2-(5-methyl-2-hydroxyphenyl)benzotriazole, 2-[2-hydroxy-3,5-bis(α,α-dimethylbenzyl)phenyl)-2H-benzotriazole, 2-(3,5-di-tert-butyl-2-hydroxyphenyl)benzotriazole, 2-(3-tert-butyl-5-methyl-2-hydroxyphenyl)-5-chlorobenzotriazole, 2-(3,5-di-tert-butyl-2-hydroxyphenyl)-5-chlorobenzotriazole, 2-(3,5-di-tert-amyl-2-hydroxyphenyl)benzotriazole, 2-(2'-hydroxy-5'-tert-octylphenyl)benzotriazole, a condensate of methyl-3-[3-tert-butyl-5-(2H-benzotriazol-2-yl)-4-hydroxyphenyl] propionate with polyethylene glycol (molecular weight: about 300), hydroxyphenylbenzotriazole derivative, bis(1,2,2,6,6-pentamethyl-4-piperidyl) 2-(3,5-di-tert-butyl-2-hydroxybenzyl)-2-n-butylmalonate, and 2,4-di-tert-butylphenyl 3,5-di-tert-butyl-4-hydroxybenzoate.

By referring to trade names, there can be exemplified NOCRAC 200, NOCRAC M-17, NOCRAC SP, NOCRAC SP-N, NOCRAC NS-5, NOCRAC NS-6, NOCRAC NS-30, NOCRAC 300, NOCRAC NS-7 and NOCRAC DAH (all above manufactured by OUCHISHINKO CHEMICAL INDUSTRIAL CO., LTD.), MARK AO-30, MARK AO-40, MARK AO-50, MARK AO-60, MARK AO-616, MARK AO-635, MARK AO-658, MARK AO-80, MARK AO-15, MARK AO-18, MARK 328 and MARK AO-37 (all above manufactured by Adeka Argus Chemical CO., LTD.), IRGANOX-245, IRGANOX-259, IRGANOX-565, IRGANOX-1010, IRGANOX-1024, IRGANOX-1035, IRGANOX-1076, IRGANOX-1081, IRGANOX-1098, IRGANOX-1222, IRGANOX-1330 and IRGANOX-1425WL (all above manufactured by Chiba-Geigy Japan Co., Ltd.), SUMILIZER GA-80 (manufactured by Sumitomo Chemical Co., Ltd.) and the like, but those to be used in the present invention are not limited to these.

Further, mono acrylate-phenol antioxidants having an acrylate group and a phenol group in combination, nitroxide compounds and the like are exemplified. Examples of the mono acrylate-phenol antioxidant include 2-tert-butyl-6-(3-tert-butyl-2-hydroxy-5-methylbenzyl)-4-methylphenyl acrylate (trade name: SUMILIZER GM), and 2,4-di-tert-amyl-6 [1-(3,5-di-tert-amyl-2-hydroxyphenyl)ethyl]phenyl acrylate (trade name: SUMILIZER GS).

The nitroxide compound is not limited, but nitroxy free radicals from cyclic hydroxyamines, such as 2,2,6,6-substituted-1-piperidinyloxy radical and 2,2,5,5-substituted-1-pyrroridinyloxy radical, are exemplified. As the substituent, alkyl groups having at most 4 carbon atoms such as a methyl group and an ethyl group are suitable. Specific examples of the nitroxy free radical compound is not limited, but include 2,2,6,6-tetramethyl-1-piperidinyloxy radical (TEMPO), 2,2,6,6-tetraethyl-1-piperidinyloxy radical, 2,2,6,6-tetramethyl-4-oxo-1-piperidinyloxy radical, 2,2,5,5-tetramethyl-1-pyrroridinyloxy radical, 1,1,3,3-tetramethyl-2-isoindolinyloxy radical, and NN-di-t-butylaminoxy radical. Stable free radical such as galvinoxyl free radical may be used in place of the nitroxy free radical.

The antioxidant may be used in combination with a light stabilizer and the combination use is especially preferable because its effect is further exhibited and thereby heat resistance is occasionally improved in particular. TINUVIN C353, TINUVIN B75 (all above manufactured by Chiba Geigy Japan Co., Ltd.) and the like in which an antioxidant and a light stabilizer have been preliminarily mixed may be used.

Examples of the plasticizer include phthalic acid esters such as dibutyl phthalate, diheptyl phthalate, di(2-ethylhexyl) phthalate and butyl benzyl phthalate; non aromatic dibasic acid esters such as dioctyl adipate and dioctyl sebacate; polyalkylene glycol esters such as diethylene glycol dibenzoate and triethylene glycol dibenzoate; phosphoric acid esters such as tricresyl phosphate and tributyl phosphate; chlorinated paraffins; hydrocarbon oils such as alkyldiphenyl and partially hydrogenated terphenyl. These may be used alone or 2 or more of them can be used in mixture depending on purpose such as the adjustment of physical properties and the adjustment of characteristic properties, but they are not always necessary. Further, these plasticizers can be added at the time of production of the polymer.

Examples of the solvent which may be used in production of the polymer include aromatic hydrocarbon solvents such as toluene and xylene; ester solvents such as ethyl acetate, butyl acetate, amyl acetate and Cellosolve acetate; ketone solvents such as methyl ethyl ketone, methyl isobutyl ketone and di-isobutyl ketone.

Various adhesiveness modifiers may be added to the composition of the present invention in order to improve adhesiveness to various supports (plastic film and the like). Examples thereof include alkylalkoxysilanes such as methyltrimethoxysilane, dimethyldimethoxysilane, trimethylmethoxysilane and n-propyltrimethoxysilane; alkylisoproenoxysilane such as dimethyldiisopropenoxysilane, methyltriisopropenoxysilane and γ-glycidoxypropylmethyldiisopropenoxysilane; alkoxysilanes having a functional group such as γ-glycidoxypropylmethyldimethoxysilane, γ-glycidoxypropyltrimethoxysilane, vinyltrimethoxysilane, vinyldimethylmethoxysilane, γ-aminopropyltrimethoxysilane, N-(β-aminoethyl)-γ-aminopropyltrimethoxysilane, N-(β-aminoethyl)-γ-aminopropylmethyldimethoxysilane, γ-mercaptopropyltrimethoxysilane and γ-mercaptopropylmethyldimethoxysilane; silicone varnishes; and polysiloxanes.

Further, a mono acrylate-phenol antioxidant may be added in the curable composition of the present invention in order to control the speed and curability of radical photo curing and improve the elongation of a cured article. The mono acrylate-phenol antioxidant is not specifically limited as long as it is a compound having a mono acrylate structure and a phenol structure. Preferable examples are 2-tert-butyl-6-(3-tert-butyl-2-hydroxy-5-methylbenzyl)-4-methylphenyl acrylate (trade name: SUMILIZER GM) and 2,4-di-tert-amyl-6-[1-(3,5-di-tert-amyl-2-hydroxyphenyl)ethyl]phenyl acrylate (trade name: SUMILIZER GS) because of easy control of physical properties of a cured article. The mono acrylate-phenol antioxidants may be used alone and 2 or more of them may be used in combination.

The amount of the mono acrylate-phenol antioxidant used is not specifically limited, but is preferably at least 0.01 part, more preferably at least 0.05 part, based on 100 parts of component (A) for purpose of providing good effect on mechanical properties of a cured article obtained. On the other hand, the amount is preferably at most 5.0 parts, more preferably at most 3.0 parts, further more preferably at most 2.0 parts, based on 100 parts of component (A).

<Curing Method>

The curable composition of the present invention is cured by using radical photo curing and cationic photo curing in combination. Specifically, the composition can be cured by active energy radiation such as UV or electron beam.

<Curing by Active Energy Radiation>

Active energy radiation source is not specifically limited, but examples thereof include irradiation of light, electron beam and the like, using a high pressure mercury lamp, a low pressure mercury lamp, an electron beam irradiation device, a halogen lamp, a light emitting diode, a semiconductor laser and the like in accordance with the nature of the photo polymerization initiator.

<Use>

The use of the curable composition of the present invention is not specifically limited, but it can be utilized for various uses including electric or electronic part materials such as a solar cell rear face sealant, electric insulating materials such as an insulating coating material for electric wires or cables, coating materials, foamed articles, electric or electronics potting materials, films, gaskets, casting materials, artificial marbles, various molding materials, and sealants for the anti-corrosion or waterproof of the edge face (cutting portion) of wire glass or sandwich glass.

Molded articles exhibiting rubber elasticity which are obtained from the curable composition of the present invention can be widely used in a field of gaskets and packings as main products. For example, in automobile field, as body parts, they can be used for a sealant for retaining air tight, the vibration inhibitor for glass, the vibration-proof material for car body portions, in particular, a window seal gasket and a gasket for door glass. As chassis parts, they can be used for vibration-proof and sound-proof rubbers for an engine and a suspension, in particular, an engine mount rubber. As engine parts, they can be used for hoses for cooling, for fuel feeding, for exhaust control and the like, and a sealant for engine oil and the like. Further, they can be also used for exhaust gas cleaning device parts and brake parts. In home electronic filed, they can be used for packings, O-rings, belts and the like. Specific examples thereof include ornaments, water-proof packings, a vibration-proof rubber, an insect proof packing for lighting equipment; vibration-proof sealants, sound absorption sealants and air sealants for a cleaner; a drip preventing cover, water-proof packings, a heater portion packing, an electrode portion packing, a safety valve diaphragm for an electric water heater; hoses, water-proof packings, and an electromagnetic valve for a device for heating sake; water-proof packings, water supply tank packings, water suction valves, water reception packings, a connection hose, a belt, a warmth-keeping heater portion packing, and a seal for steam blowoff outlet for a steam oven range or a jar/rice cooker; an oil packing, O-rings, a drain packing, a pressuring tube, a ventilating tube, Packings for air supply and exhaust, a vibration-proof rubber, a fuel inlet packing, an oil gauge packing, an oil pipe, a diaphragm valve, a ventilation pipe and the like for a combustion device; a speaker gasket, a speaker edge, a turn table sheet, a belt, a pulley and the like for acoustic equipment. In construction filed, they can be used for a gasket for construction (zipper gasket), pneumatic structure roofing materials, water-proof materials, a regular-shaped sealant, vibration-proof materials, sound proofing materials, setting block, slide members and the like. In sport field, they can be used for all-weather pavement materials, gymnasium floor and the like as sport floor, shoe sole materials, middle sole materials and the like as sport shoes, golf balls and the like as balls for ball games. In vibration-proof rubber field, they can be used for vibration-proof rubbers for automobiles, vibration-proof rubbers for rail road vehicles, vibration-proof rubbers for airplanes, fender beam and the like. In marine and civil engineering fields, they can be used for a rubber expansion joint, a support, a water bar, a water-proof sheet, a rubber dam, elastic pavement, a vibration-proof pat, a protective body and the like as materials for construction; rubber frames, a rubber packer, a rubber skirt, a sponge mat, a mortar hose, a mortar strainer and the like as engineering works sub-materials; rubber sheets, an air hose and the like as engineering works subsidiary materials; a rubber buoy, wave absorbing materials and the like as safety countermeasure commodities; an oil fence, a silt fence, antifouling materials, a marine hose, a dressing hose, an oil skimmer and the like as environmental preservation commodities. Additionally, they can be also used for a rubber board, a mat, a foam board and the like.

BEST MODE FOR CARRYING OUT THE INVENTION

The curable composition of the present invention is a curable composition for radical optical curing and cationic optical curing in combination, comprising the under-mentioned components (A), (B), (C) and (D) as essential components.

(A) a vinyl polymer having two or more groups represented by general formula (1):

—OC(O)C(R$^a$)=CH$_2$ (1)

wherein R$^a$ represents a hydrogen atom or an organic group having 1 to 20 carbons, per molecule, the group represented by general formula (1) being present at the molecular ends;

(B) an epoxy compound and/or an oxetane compound;

(C) a radical photopolymerization initiator; and (D) a cationic photopolymerization initiator.

The polymer of component (A) is an acrylic acid ester polymer and its main chain is preferably produced by the living radical polymerization, more preferably by the atom transfer radical polymerization. Further, the addition of an acrylic acid ester monomer is effective from the viewpoint of the improvement of strength, the addition of elongation and the improvement of workability and the like of the cured article. It is preferable that the epoxy compound and/or oxetane compound of component (B) do not have an aromatic ring. The strength and elongation can be improved by adding a compound having both an epoxy group and a (meth)acryloyl group in the structure (E) as the binder for components (A) and (B).

EXAMPLES

The specific Examples of the present invention are illustrated together with Comparative Examples, but the present invention is not limited to the under-mentioned Examples.

In the under-mentioned Examples, "number average molecular weight" and "molecular weight distribution (the ratio of weight average molecular weight to number average molecular weight)" were determined by a standard polystyrene conversion method using gel permeation chromatography (GPC). A column in which a crosslinked polystyrene gel was packed (Shodex GPC K-804 manufactured by Showa Denko K. K.) was used as a GPC column and chloroform was used as GPC solvent.

In the under-mentioned Examples, "average number of an end (meth)acryloyl group" is the number of the (meth)acryloyl group introduced per molecule of the polymer and determined based on the number average molecular weight determined by $^1$H NMR analysis and GPC.

The viscosity of the curable compositions and the mechanical properties of cured articles prepared in the under-mentioned Examples and Comparative Examples were evaluated by the following methods.

[Viscosity Measurement]

The viscosity of the curable compositions prepared in Examples and Comparative Examples was measured under the conditions of a measurement temperature of 23° C. and a cone of 3° using an E type viscometer (VISCONIC ED type; manufactured by Tokyo Keiki Co., Ltd.) according to JIS K 7117-2.

[Evaluation of Mechanical Properties]

The mechanical properties (modulus (M30) at 30% elongation, strength (Tb) at break and elongation (Eb) at break) of the cured articles prepared in Examples and Comparative Examples were measured for dumbbell No. 2 specimen using an autograph AG-2000A manufactured by Shimadzu Corporation according to JIS K 7113.

Production Example 1

Synthesis of poly(n-butyl acrylate/ethyl acrylate/2-methoxyethyl acrylate) having acryloyl Groups at Both Ends N-butyl acrylate/ethyl acrylate/2-methoxyethyl acrylate were polymerized at a ratio of 25/46/29 by mole using cuprous bromide as a catalyst, pentamethyldiethylenetriamine as a ligand and diethyl 2,5-dibromoadipate as an initiator to obtain poly(n-butyl acrylate/ethyl acrylate/2-methoxyethyl acrylate) having a number average molecular weight of 16,500, a molecular weight distribution of 1.13 and bromine groups at its ends.

400 g of the polymer was dissolved in N,N-dimethylacetoamide (400 ml), 10.7 g of potassium acrylate was added and the mixture was heated with stirring at 70° C. for 6 hours under nitrogen atmosphere to obtain a mixture composed of poly(n-butyl acrylate/ethyl acrylate/2-methoxyethyl acrylate) having acryloyl groups at both ends (hereinafter referred to as polymer [1]). After the N,N-dimethylacetoamide in the mix solution was removed under reduced pressure, toluene was added to the residue and the insoluble portion was removed by filtration. The toluene in the filtrate was removed under reduced pressure to give a purified polymer [1].

With respect to polymer [1] having acryloyl groups at both ends after purification, the number average molecular weight was 16,900, the molecular weight distribution was 1.14 and the average number of end acryloyl group was 1.8 (namely, the introduction percentage of the acryloyl group to each end was 90%).

Production Example 2

Synthesis of poly(n-butyl acrylate/ethyl acrylate/2-methoxyethyl acrylate) having acryloyl Group at One End N-butyl acrylate/ethyl acrylate/2-methoxyethyl acrylate were polymerized at a ratio of 25/46/29 by mole using cuprous bromide as a catalyst, pentamethyldiethylenetriamine as a ligand and ethyl 2-bromobutyrate as an initiator to obtain poly(n-butyl acrylate/ethyl acrylate/2-methoxyethyl acrylate) having a number average molecular weight of 3,700, a molecular weight distribution of 1.14 and a bromine group at one end.

1,050 g of the polymer was dissolved in N,N-dimethylacetoamide (1,050 g), 56.2 g of potassium acrylate was added and the mixture was heated with stirring at 70° C. for 4 hours under nitrogen atmosphere to obtain a mixture composed of poly(n-butyl acrylate/ethyl acrylate/2-methoxyethyl acrylate) having an acryloyl group at one end (hereinafter referred to as polymer [2]). After the N,N-dimethylacetoamide in the mix solution was removed under reduced pressure, toluene was added to the residue and the insoluble portion was removed by filtration. The toluene in the filtrate was removed under reduced pressure to give a purified polymer [2].

With respect to polymer [2] having an acryloyl group at one end after purification, the number average molecular weight was 3,800, the molecular weight distribution was 1.15 and the average number of end acryloyl group was 1.0 (namely, the introduction percentage of the acryloyl group to one end was nearly 100%).

Example 1

0.2 Part of 2,2-diethoxyacetophenone, 30 parts of EPOLIGHT 4000 (a hydrogenated bisphenol A epoxy resin available from KYOEISHA CHEMICAL Co., Ltd.), 1.5 parts of OPTOMER SP172 (a cationic photopolymerization initiator available from Asahi Denka Co., Ltd.) (5 parts based on EPOLIGHT 4000) and 1 part of Irganox 1010 [pentaerythritol tetrakis[3-(3,5-di-t-butyl-4-hydroxyphenyl)propionate] available from Chiba Specialty Chemicals Co., Ltd.) were added to 100 parts of polymer [1] obtained in Production Example 1 and the mixture was adequately mixed to obtain a curable composition.

Then, the curable composition in a sheet form was passed 5 times with respect to each of front and rear surfaces thereof under a metal halide lamp (80 W/cm, an irradiation distance of 15 cm and a belt speed of 1.0 m/min) for light irradiation to obtain a sheet-like cured article with a thickness of about 2 mm.

The viscosity of the curable composition and the mechanical properties of the cured article were measured. The results are respectively shown in Tables 1 and 2.

Example 2

0.2 Part of 2,2-diethoxyacetophenone, 50 parts of EPOLIGHT 4000, 2.5 parts of OPTOMER SP172 (5 parts based on EPOLIGHT 4000) and 1 part of Irganox 1010 were added to 100 parts of polymer [1] obtained in Production Example 1 and the mixture was adequately mixed to obtain a curable composition.

Then, the curable composition in a sheet form was passed 5 times with respect to each of front and rear surfaces thereof under a metal halide lamp (80 W/cm, an irradiation distance of 15 cm and a belt speed of 1.0 m/min) for light irradiation to obtain a sheet-like cured article with a thickness of about 2 mm.

The viscosity of the curable composition and the mechanical properties of the cured article were measured. The results are respectively shown in Tables 1 and 2.

Example 3

0.2 Part of 2,2-diethoxyacetophenone, 70 parts of EPOLIGHT 4000, 3.5 parts of OPTOMER SP172 (5 parts based on EPOLIGHT 4000) and 1 part of Irganox 1010 were added to 100 parts of Polymer [1] obtained in Production Example 1 and the mixture was adequately mixed to obtain a curable composition.

Then, the curable composition in a sheet form was passed 5 times with respect to each of front and rear surfaces thereof under a metal halide lamp (80 W/cm, an irradiation distance of 15 cm and a belt speed of 1.0 m/min) for light irradiation to obtain a sheet-like cured article with a thickness of about 2 mm.

The viscosity of the curable composition and the mechanical properties of the cured article were measured. The results are respectively shown in Tables 1 and 2.

Example 4

0.2 Part of 2,2-diethoxyacetophenone, 100 parts of EPOLIGHT 4000, 5 parts of OPTOMER SP172 (5 parts based on EPOLIGHT 4000) and 1 part of Irganox 1010 were added to 100 parts of Polymer [1] obtained in Production Example 1 and the mixture was adequately mixed to obtain a curable composition.

Then, the curable composition in a sheet form was passed 5 times with respect to each of front and rear surfaces thereof under a metal halide lamp (80 W/cm, an irradiation distance of 15 cm and a belt speed of 1.0 m/min) for light irradiation to obtain a sheet-like cured article with a thickness of about 2 mm.

The viscosity of the curable composition and the mechanical Properties of the cured article were measured. The results are respectively shown in Tables 1 and 2.

Example 5

10 Parts of VISCOAT #155 (available from Osaka Organic Chemical Industry Ltd., multifunctional monomer, cyclohexyl acrylate), 0.24 part of 2,2-diethoxyacetophenone, 70 parts of EPOLIGHT 4000, 3,5 parts of OPTOMER SP172 (5 parts based on EPOLIGHT 4000) and 1 part of Irganox 1010 were added to 100 parts of polymer [1] obtained in Production Example 1 and the mixture was adequately mixed to obtain a curable composition.

Then, the curable composition in a sheet form was passed 5 times with respect to each of front and rear surfaces thereof under a metal halide lamp (80 W/cm, an irradiation distance of 15 cm and a belt speed of 1.0 m/min) for light irradiation to obtain a sheet-like cured article with a thickness of about 2 mm.

The viscosity of the curable composition and the mechanical properties of the cured article were measured. The results are respectively shown in Tables 1 and 2.

Example 6

50 Parts of polymer [2] obtained in Production Example 2, 0.3 part of 2,2-diethoxyacetophenone, 70 parts of EPOLIGHT 4000, 3.5 parts of OPTOMER SP172 (5 parts based on EPOLIGHT 4000) and 1 part of Irganox 1010 were added to 100 parts of polymer [1] obtained in Production Example 1 and the mixture was adequately mixed to obtain a curable composition.

Then, the curable composition in a sheet form was passed 5 times with respect to each of front and rear surfaces thereof under a metal halide lamp (80 W/cm, an irradiation distance of 15 cm and a belt speed of 1.0 m/min) for light irradiation to obtain a sheet-like cured article with a thickness of about 2 mm.

The viscosity of the curable composition and the mechanical properties of the cured article were measured. The results are respectively shown in Tables 1 and 2.

Example 7

5 Parts of glycidyl methacrylate, 0.2 part of 2,2-diethoxyacetophenone, 50 parts of EPOLIGHT 4000, 2.5 parts of OPTOMER SP172 (5 parts based on EPOLIGHT 4000) and 1 part of Irganox 1010 were added to 100 parts of polymer [1] obtained in Production Example 1 and the mixture was adequately mixed to obtain a curable composition.

Then, the curable composition in a sheet form was passed 5 times with respect to each of front and rear surfaces thereof under a metal halide lamp (80 W/cm, an irradiation distance of 15 cm and a belt Speed of 1.0 m/min) for light irradiation to obtain a sheet-like cured article with a thickness of about 2 mm.

The viscosity of the curable composition and the mechanical properties of the cured article were measured. The results are respectively shown in Tables 1 and 2.

Comparative Example 1

0.20 Part of 2,2-diethoxyacetophenone and 1.0 part of Irganox 1010 were added to 100 parts of polymer [1] obtained in Production Example 1 and the mixture was adequately mixed to obtain a curable composition. The viscosity of the curable composition at a room temperature was 510 Pa·s and workability such as mixing and pouring was Poor.

Then, the curable composition in a sheet form was passed 3 times under a metal halide lamp (80 W/cm, an irradiation distance of 15 cm and a belt speed of 1.0 m/min) for light irradiation to obtain a sheet-like cured article with a thickness of about 2 mm.

The mechanical properties of the cured article were measured. The results are shown in Table 2.

The viscosity of the composition is shown in Table 1.

TABLE 1

| Ex./Com. Ex. | Viscosity (23° C.) [Pa · s] |
|---|---|
| Ex. 1 | 150 |
| 2 | 91 |
| 3 | 65 |
| 4 | 43 |
| 5 | 20 |
| 6 | 32 |
| 7 | 62 |
| Com. Ex. 1 | 510 |

TABLE 2

| Ex./Com. Ex. | M30 (MPa) | Tb (MPa) | Eb (%) |
|---|---|---|---|
| Ex. 1 | 0.52 | 0.94 | 52 |
| 2 | 1.09 | 1.79 | 49 |
| 3 | 1.80 | 2.47 | 41 |
| 4 | 4.39 | 5.33 | 37 |
| 5 | 1.72 | 3.15 | 55 |
| 6 | 1.51 | 2.00 | 42 |
| 7 | 2.41 | 5.25 | 70 |
| Com. Ex. 1 | 0.26 | 0.48 | 59 |

The invention claimed is:

1. A composition curable by radical photo curing and cationic photo curing in combination, comprising the undermentioned components (A), (B), (C) and (D) as essential components:
   (A) a vinyl polymer having two or more groups represented by general formula (1):

$$-OC(O)C(R^a)=CH_2 \qquad (1)$$

wherein $R^a$ represents a hydrogen atom or an organic group having 1 to 20 carbon atoms, per molecule, the group represented by general formula (1) being present at one or more molecular ends;
   (B) an epoxy compound and/or an oxetane compound;
   (C) a radical photopolymerization initiator; and
   (D) a cationic photopolymerization initiator, and
   wherein the vinyl monomer constituting the main chain of component (A) comprises a (meth)acrylic monomer as a main component and a (meth)acryloyl group exists at the molecular end.

2. The curable composition of claim 1, wherein the vinyl monomer constituting the main chain of component (A) comprises an acrylic acid ester monomer as a main component.

3. The curable composition of claim 1, wherein the vinyl monomer constituting the main chain of component (A) contains at least 2 monomers selected from the group consisting of butyl acrylate, ethyl acrylate and 2-methoxyethyl acrylate.

4. The curable composition of claim 1, wherein $R^a$ is a hydrogen atom or a hydrocarbon group having 1 to 20 carbon atoms.

5. The curable composition of claim 4, wherein $R^a$ is a hydrogen atom or a methyl group.

6. The curable composition of claim 1, wherein component (A) is produced by reacting a compound indicated by general formula (2):

$$M^+ - OC(O)C(R^a)=CH_2 \qquad (2)$$

wherein $R^a$ represents a hydrogen atom or an organic group having 1 to 20 carbon atoms and $M^+$ represents an alkali metal ion or a quaternary ammonium ion, with a vinyl polymer having halogen groups at the molecular ends.

7. The curable composition of claim 6, wherein the vinyl polymer having halogen groups at the molecular ends has a group indicated by general formula (3):

$$-CR^1R^2X \qquad (3)$$

wherein $R^1$ and $R^2$ represent a group bonded to the ethylenically unsaturated group of a vinyl monomer, and X represents a chlorine atom, a bromine atom or an iodine atom.

8. The curable composition of claim 1, wherein component (A) is produced by reacting a compound indicated by general formula (4):

$$X^1 - C(O)C(R^a)=CH_2 \qquad (4)$$

wherein $R^a$ represents a hydrogen atom or an organic group having 1 to 20 carbon atoms, and $X^1$ represents a chlorine atom, a bromine atom or a hydroxyl group, with a vinyl polymer having hydroxyl groups at the ends.

9. The curable composition of claim 1, wherein component (A) is produced by:
(1) reacting a diisocyanate compound with a vinyl polymer having hydroxyl groups at the ends, and
(2) reacting a compound indicated by general formula (5):

$$HO-R'-OC(O)C(R^a)=CH_2 \qquad (5)$$

wherein $R^a$ represents a hydrogen atom or an organic group having 1 to 20 carbon atoms and R' represents a divalent organic group having 2 to 20 carbon atoms, with the residual isocyanate group.

10. The curable composition of claim 1, wherein the main chain of component (A) is produced by a living radical polymerization of a vinyl monomer.

11. The curable composition of claim 10, wherein the living radical polymerization is atom transfer radical polymerization.

12. The curable composition of claim 11, wherein a transition metal complex being the catalyst of the atom transfer radical polymerization is selected from complexes of copper, nickel, ruthenium and iron.

13. The curable composition of claim 12, wherein the transition metal complex is a complex of copper.

14. The curable composition of claim 1, wherein the main chain of component (A) is produced by the polymerization of a vinyl monomer using a chain transfer agent.

15. The curable composition of claim 1, wherein component (A) has a number average molecular weight of 3,000 or more.

16. The curable composition of claim 1, wherein the vinyl polymer of component (A) has a ratio of weight average molecular weight to number average molecular weight of less than 1.8 determined by gel permeation chromatography.

17. The curable composition of claim 1, which further contains a monomer and/or an oligomer having a radical polymerizable group.

18. The composition of claim 1, which further contains a monomer and/or an oligomer having an anionic polymerizable group.

19. The curable composition of claim 17, which contains a monomer and/or an oligomer having a (meth)acryloyl group.

20. The curable composition of claim 19, which contains a monomer and/or an oligomer having a (meth)acryloyl group and having a number average molecular weight of 5,000 or less.

21. The curable composition of claim 1, wherein the epoxy compound and/or oxetane compound of component (B) has no aromatic ring.

22. The curable composition of claim 1, which further contains (E) a compound having an epoxy group and a (meth)acryloyl group in its molecule.

23. The curable composition of claim 22, wherein component (E) is glycidyl methacrylate.

* * * * *